US006388278B1

(12) United States Patent
Suzuki et al.

(10) Patent No.: US 6,388,278 B1
(45) Date of Patent: May 14, 2002

(54) SOLID STATE IMAGE PICKUP DEVICE AND ITS DRIVING METHOD

(75) Inventors: Nobuo Suzuki; Kazuyuki Masukane, both of Miyagi (JP)

(73) Assignee: Fuji Photo Film Co., Ltd., Minami-ashigara (JP)

( * ) Notice: Subject to any disclaimer, the term of this patent is extended or adjusted under 35 U.S.C. 154(b) by 0 days.

(21) Appl. No.: 09/669,667

(22) Filed: Sep. 26, 2000

(30) Foreign Application Priority Data

Sep. 27, 1999 (JP) ............................................ 11-273409
Sep. 14, 2000 (JP) ........................................ 2000-280586

(51) Int. Cl.[7] .......................................... H01L 21/339
(52) U.S. Cl. ...................................... 257/222; 257/223
(58) Field of Search ................................ 257/222, 223

(56) References Cited

U.S. PATENT DOCUMENTS

| 5,238,864 A | * | 8/1993 | Maegawa et al. |
| 5,306,906 A | | 4/1994 | Aoki et al. |
| 5,614,740 A | * | 3/1997 | Gardner et al. |
| 5,929,474 A | * | 7/1999 | Huang et al. |

FOREIGN PATENT DOCUMENTS

WO    WO 93/19489    *  9/1993

* cited by examiner

Primary Examiner—Stephen D. Meier
(74) Attorney, Agent, or Firm—Arent Fox Kintner Plotkin & Kahn PLLC

(57) ABSTRACT

IT-CCD has a number of photoelectric conversion elements disposed in a pixel shift layout in a plurality of rows and columns, a plurality of vertical transfer CCDs for transferring signal charges accumulated in the photoelectric conversion elements toward a horizontal transfer CCD in a zigzag way, and readout gate regions for controlling for corresponding photoelectric conversion elements to read the signal charges accumulated in the photoelectric conversion elements to the vertical transfer CCDs. In manufacturing such IT-CCD, for twos of a plurality of photoelectric conversion element columns, a vertical transfer CCD is provided in an area in plan view between the two photoelectric conversion element columns, and a plurality of charge transfer stages constituting a adjusting portion are formed downstream of the downstream ends of the vertical transfer CCDs. The horizontal transfer CCD can be formed easily without using highly sophisticated ultra fine patterning techniques and power consumption of the horizontal transfer CCD can be suppressed low.

13 Claims, 15 Drawing Sheets

SOLID STATE IMAGE PICKUP DEVICE AND ITS DRIVING METHOD

This application is based on Japanese Patent Applications HEI 11-273409, filed on Sep. 27, 1999, and 2000-280586, filed on Sep. 14, 2000, the entire contents of which are incorporated herein by reference.

BACKGROUND OF THE INVENTION

1. Field of the Invention

The present invention relates to a solid state image pickup device to be used as an area image sensor and its driving method, and more particularly to a solid state image pickup device suitable for use as an area image sensor of an electronic still camera, and its driving method.

2. Description of the Related Art

After mass production techniques for charge-coupled devices (CCD) have been established, video cameras, electronic still cameras and the like utilizing CCD type solid state image pickup devices as area image sensors are prevailing rapidly. CCD type solid image pickup devices are classified into several types, depending upon their structures. One type is an interline transfer type solid state image pickup device (this solid state image pickup device is hereinafter described as "IT-CCD" in abbreviation).

IT-CCD has a number of photoelectric conversion elements disposed along a plurality of columns and rows at a constant pitch. Each photoelectric conversion element column is constituted of a plurality of photoelectric conversion elements, and each photoelectric conversion element row is also constituted of a plurality of photoelectric conversion elements.

A number of photoelectric conversion elements each made of a p-n photodiode are formed, for example, by forming a p-type well in a desired principal surface of a semiconductor substrate and forming n-type regions (n-type impurity doped regions) having a desired shape in the p-type well as many as the number of photoelectric conversion elements to be formed. If necessary, a $p^+$-type region ($p^+$-type impurity doped region) is formed on each n-type region. Signal charges are accumulated in the n-type region. The n-type region functions as a signal charge accumulation region.

In this specification, the term "photoelectric conversion element" is used in some cases to mean only the signal charge accumulation region. In this specification, it is assumed that "adjacent to the photoelectric conversion element" means "adjacent to the signal charge accumulation region constituting the photoelectric conversion element" and that "contiguous to the photoelectric conversion element" means "contiguous to the signal charge accumulation region constituting the photoelectric conversion element".

A charge transfer channel is formed adjacent to each photoelectric conversion element column. IT-CCD has a plurality of charge transfer channels. Each charge transfer channel is used for transferring signal charges accumulated in all photoelectric conversion elements of the photoelectric conversion element column adjacent to the charge transfer channel.

A plurality of transfer electrodes traversing in plan view each charge transfer channel are formed on an electric insulating film over the surface of the semiconductor substrate. A cross area in plan view between each transfer electrode and the charge transfer channel functions as one charge transfer stage. A vertical transfer CCD is therefore formed by the channel transfer channel and transfer electrodes.

In this specification, a charge transfer stage forming region of each transfer electrode constituting the vertical transfer CCD is called a "transfer path forming area".

Generally, each vertical transfer CCD of an interlace drive type IT-CCD has two charge transfer stages per one photoelectric conversion element. Generally, each vertical transfer CCD of an all-pixel read type IT-CCD has three or four charge transfer stages per one photoelectric conversion element. One IT-CCD has vertical transfer CCDs same in number as the number of photoelectric conversion element columns formed in IT-CCD.

Each photoelectric conversion element photoelectrically converts incidence light into signal charges and stores the charges. The signal charges stored in each photoelectric conversion element are read to the corresponding charge transfer channel at a predetermined timing.

For a read control of signal charges from the photoelectric conversion element to the charge transfer channel, a readout gate region is formed adjacent to each photoelectric conversion element on the surface of the semiconductor substrate. This readout gate region has generally a conductivity type opposite to that of the photoelectric conversion element and charge transfer channel, in order to form a potential barrier relative to the signal charges. Each readout gate region is also adjacent to a predetermined region of the charge transfer channel.

A readout gate electrode structure is formed on the readout gate region. The readout gate electrode structure is constituted of a partial region of the transfer path forming area of a predetermined transfer electrode constituting the vertical transfer CCD. As a high voltage is applied to the readout gate structure to remove the potential barrier in the readout gate region, signal charges accumulated in the photoelectric conversion element can be read to the charge transfer channel.

Signal charges read to each charge transfer channel are transferred to an output transfer path by each vertical transfer CCD constituted of the charge transfer channel. The output transfer path is generally made of CCD (this CCD is called in some cases a "horizontal transfer CCD").

The output transfer path made of the horizontal transfer CCD has N charger transfer stages per one vertical transfer CCD. Each charge transfer stage has usually one potential barrier and one potential well. In this case, N=2. If the charge transfer stage has a uniform potential, then N=3 or larger.

The output transfer path sequentially transfers the received signal charges along a lengthwise direction of the photoelectric conversion element row (this direction is hereinafter simply called a "row direction"), to an output unit. Similar to the vertical transfer CCD, the output transfer path is formed on the semiconductor substrate.

The vertical transfer CCD and horizontal transfer CCD have the photoelectric conversion function similar to photodiodes. In order to avoid unnecessary photoelectric conversion by the vertical transfer CCD and horizontal transfer CCD, a light shielding film is formed on an area from a photosensitive area with photoelectric conversion elements to the horizontal transfer CCD area. The light shielding film has an opening with a predetermined shape formed on each photoelectric conversion element (photodiode). An opening is formed for each photoelectric conversion element. Generally, the inner edge of the opening is inner in plan view than the outer edge, in plan view, of the signal charge accumulation region of the photoelectric conversion element.

A pixel is constituted of: one photoelectric conversion element; one readout gate region formed contiguous to the photoelectric conversion element; one readout gate electrode structure covering in plan view the readout gate region; and two to four charge transfer stages (two to four charge transfer stages on the vertical transfer CCD) associating to the photoelectric conversion element. The area of the photoelectric conversion element exposed in plan view in the opening functions as a light receiving area.

The shape and area of the light receiving area of the pixel of IT-CCD are therefore substantially determined by the shape and area, in plan view, of the opening formed in the light shielding film.

The performance such as a resolution and sensitivity of IT-CCD widely prevailing nowadays is desired to be improved further.

The resolution of IT-CCD depends largely on the pixel density. The higher the pixel density, the resolution is easier to be improved. The sensitivity of IT-CCD depends largely on the area of the light receiving area of each pixel. The larger the light receiving area of each pixel, the sensitivity is easier to be raised.

IT-CCD described in Japanese Patent Publication No. 2825702 (although this Publication has the title "Solid State Image Pickup Device", in this specification it is described as "IT-CCD") has an improved pixel density while the reduction in the light receiving area of each pixel is suppressed.

This IT-CCD has a number of photoelectric conversion elements disposed along a plurality of columns and rows at a constant pitch. Each photoelectric conversion element column and each photoelectric conversion element row contain a plurality of photoelectric conversion elements. A plurality of photoelectric conversion elements constituting an even column are shifted in the column direction by about a half of the pitch between adjacent photoelectric conversion elements in each column, from a plurality of photoelectric conversion elements constituting an odd column. Similarly, a plurality of photoelectric conversion elements constituting an even row are shifted in the row direction by about a half of the pitch between adjacent photoelectric conversion elements in each row, from a plurality of photoelectric conversion elements constituting an odd row. Each photoelectric conversion element column contains photoelectric conversion elements of only the even rows or odd rows.

A vertical transfer CCD is disposed for each photoelectric conversion element column in order to transfer signal charges accumulated in the photoelectric conversion elements. The vertical transfer CCD is adjacent to the corresponding photoelectric conversion element column. Each vertical transfer CCD includes a plurality of transfer electrodes. These transfer electrodes are disposed in a honeycomb shape, in general. In each rectangular area defined by a plurality of transfer electrodes disposed in the honeycomb shape, the photoelectric conversion element is disposed in plan view.

Each vertical transfer CCD is used for transferring signal charges accumulated in all photoelectric conversion elements of the photoelectric conversion element column adjacent to the vertical transfer CCD. The vertical transfer CCD transfers the signal charges in a zigzag way to the predetermined destination.

In IT-CCD described in the above-described Publication, a number of photoelectric conversion elements and a plurality of transfer electrodes (transfer electrodes for the vertical transfer CCD) are disposed as described above to improve the pixel density while the reduction in the light receiving area of each pixel is suppressed.

In this specification, the above-described layout of a number of photoelectric conversion elements is hereinafter called a "pixel-shift layout".

For example, a ½-inch, two-million-pixel IT-CCD with the pixel-shift layout used for an electronic still camera has a pixel pitch of about 2.8 $\mu$m in a lengthwise direction (this direction is hereinafter called a "direction $D_H$") of the photoelectric conversion element row. A ⅓-inch, two-million-pixel IT-CCD with the pixel-shift layout used for an electronic still camera has a pixel pitch of about 2.1 $\mu$m in the direction $D_H$.

A four-phase drive type CCD is widely used as the vertical transfer CCD, and a two-phase drive type CCD is widely used as the horizontal transfer CCD.

Pixels can be formed relatively easily at a pitch of 2.1 $\mu$m in the direction $D_H$ for IT-CCD having a four-phase drive type vertical transfer CCDs and two-phase drive type horizontal CCD. However, the horizontal transfer CCD of this IT-CCD has four electrodes per one vertical transfer CCD. Namely, four transfer electrodes are formed in an area having a width of 2.1 $\mu$m. The width of each transfer electrode is about 0.5 $\mu$m.

In forming IT-CCD having such a horizontal transfer CCD, highly sophisticated ultra fine patterning techniques are required to make the chip size compact.

Since the horizontal transfer CCD has four transfer electrodes per one vertical transfer CCD, pulse supply terminals for supplying drive pulses to the horizontal transfer CCD have large electrostatic capacitance.

In order to raise the read frame frequency of a high resolution IT-CCD having pixels larger than two million pixels, high speed drive pulses at about 200 MHz are used for driving the horizontal transfer CCD.

Therefore, a power consumption of the horizontal transfer CCD increases, for example, to several tens mW. An increase in the power consumption results in a short battery life of a battery driven electronic still camera.

SUMMARY OF THE INVENTION

It is an object of the present invention to provide an IT-CCD and its driving method capable of improving a pixel density with ease without relying upon highly sophisticated ultra fine patterning techniques and suppressing an increase in a power consumption with ease.

According to one aspect of the present invention, there is provided a solid state image pickup device, comprising: a semiconductor substrate; a number of photoelectric conversion elements disposed on a surface of the semiconductor substrate in a plurality of columns and rows, a photoelectric conversion element column and a photoelectric conversion element row each being composed of a plurality of photoelectric conversion elements, a plurality of photoelectric conversion elements of an even column being shifted in a column direction by about a half of the pitch between adjacent photoelectric conversion elements in each photoelectric conversion element column, from a plurality of photoelectric conversion elements of an odd column, and a plurality of photoelectric conversion elements of an even row being shifted in a row direction by about a half of the pitch between adjacent photoelectric conversion elements in each photoelectric conversion element row, from a plurality of photoelectric conversion elements of an odd row; charge transfer channels each provided for two photoelectric conversion element columns and formed in the surface of the semiconductor substrate in an area in plan view between the two photoelectric conversion element columns, said charge transfer channel extending as a whole along a direction of the photoelectric conversion element column and having a zigzag shape; a plurality of transfer electrodes formed on the semiconductor substrate, traversing in plan view each of said charge transfer channels, said transfer electrode having transfer path forming areas same in number as said charge transfer channels, the transfer path forming area forming one charge transfer stage in a cross area in plan view with a corresponding charge transfer channel, adjacent two transfer electrodes with one photoelectric conversion element row being interposed therebetween repeating in plan view divergence and convergence and surrounding in plan view each photoelectric conversion element in the photoelectric conversion element row of an even or odd row to define photoelectric conversion element region, said transfer electrode extending as a whole along a direction of the photoelectric conversion element row; a readout gate region provided for each photoelectric conversion element in the surface of the semiconductor substrate to be contiguous to the photoelectric conversion element and to a corresponding charge transfer channel, said readout gate region corresponding to the photoelectric conversion element of the even row and said readout gate region corresponding to the photoelectric conversion element of the odd row being covered in plan view with different transfer electrodes; and an adjusting portion formed downstream of downstream ends of said charge transfer channels, said adjusting portion including a plurality of charge transfer stages for adjusting a phase of signal charges transferred from each of said charge transfer channels.

According to another aspect of the present invention, there is provided a driving method for a solid state image pickup device comprising: a semiconductor substrate; a number of photoelectric conversion elements disposed on a surface of the semiconductor substrate in a plurality of columns and rows, a photoelectric conversion element column and a photoelectric conversion element row each being composed of a plurality of photoelectric conversion elements, a plurality of photoelectric conversion elements of an even column being shifted in a column direction by about a half of the pitch between adjacent photoelectric conversion elements in each photoelectric conversion element column, from a plurality of photoelectric conversion elements of an odd column, and a plurality of photoelectric conversion elements of an even row being shifted in a row direction by about a half of the pitch between adjacent photoelectric conversion elements in each photoelectric conversion element row, from a plurality of photoelectric conversion elements of an odd row; charge transfer channels each provided for two photoelectric conversion element columns and formed in the surface of the semiconductor substrate in an area in plan view between the two photoelectric conversion element columns, said charge transfer channel extending as a whole along a direction of the photoelectric conversion element column and having a zigzag shape; a plurality of transfer electrodes formed on the semiconductor substrate, traversing in plan view each of said charge transfer channels, said transfer electrode having transfer path forming areas same in number as said charge transfer channels, the transfer path forming area forming one charge transfer stage in a cross area in plan view with a corresponding charge transfer channel, adjacent two transfer electrodes with one photoelectric conversion element row being interposed therebetween repeating in plan view divergence and convergence and surrounding in plan view each photoelectric conversion element in the photoelectric conversion element row of an even or odd row to define photoelectric conversion element region, said transfer electrode extending as a whole along a direction of the photoelectric conversion element row; a readout gate region provided for each photoelectric conversion element in the surface of the semiconductor substrate to be contiguous to the photoelectric conversion element and to a corresponding charge transfer channel, said readout gate region corresponding to the photoelectric conversion element of the even row and said readout gate region corresponding to the photoelectric conversion element of the odd row being covered in plan view with different transfer electrodes; and an adjusting portion formed downstream of downstream ends of said charge transfer channels, said adjusting portion including a plurality of charge transfer stages for adjusting a phase of signal charges transferred from each of said charge transfer channels, the driving method comprising the steps of: reading the signal charges accumulated in each photoelectric conversion element of at least one photoelectric conversion element row, to the charge transfer channel corresponding to the photoelectric conversion element via the readout gate region contiguous to the photoelectric conversion element, during one vertical blanking period; and converting the signal charges read to the charge transfer channel into an image signal and outputting the image signal, during a period after the one vertical blanking period and before a next vertical blanking period.

In the solid state image pickup device described above, one vertical transfer CCD is constituted of one charge transfer channel and a plurality of transfer electrodes traversing in plan view the charge transfer channels. In other words, one vertical transfer CCD is provided for two photoelectric conversion element columns. Although only one vertical transfer CCD is provided for two photoelectric conversion element columns, signal charges can be read from all photoelectric conversion elements.

With this solid state image pickup device, the number of vertical transfer CCDs necessary for reading signal charges from all photoelectric conversion elements can be reduced to a half of the number of vertical transfer CCDs of a conventional solid state image pickup device. The total number of charger transfer stages of the horizontal transfer CCD and the total number of transfer electrodes can therefore be reduced to halves of those of a conventional solid state image pickup device.

For example, a solid image pickup device having a large number of pixels of two millions can be manufactured without narrowing the width of a transfer electrode of each transfer stage of the horizontal transfer CCD. Namely, without using highly sophisticated ultra fine patterning techniques, a solid image pickup device having a large number of pixels of two millions can be manufactured.

Since the total number of charge transfer stages of the horizontal transfer CCD can be reduced to a half of that of a conventional solid state image pickup device, an increase in the electrostatic capacitance of pulse supply terminals used for supplying drive pulses to the horizontal transfer CCD can be suppressed. An increase in power consumption can therefore be suppressed easily.

DETAILED DESCRIPTION OF THE PREFERRED EMBODIMENTS

Figure 1:
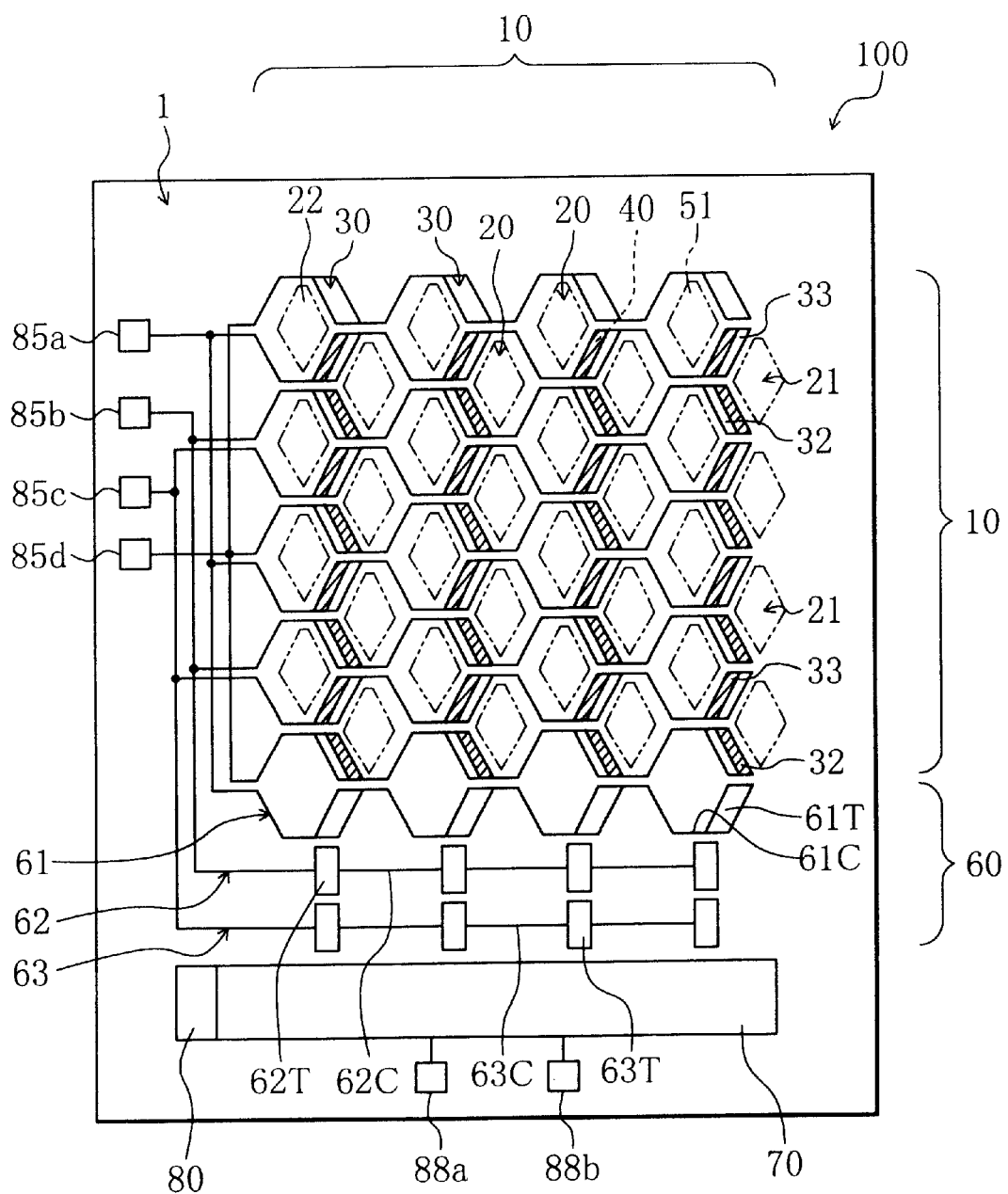
FIG. 1 is a schematic plan view showing an IT-CCD according to a first embodiment.

FIG. 1 is a schematic plan view of an IT-CCD 100 according to a first embodiment. This IT-CCD is of an interlace drive type having a number of pixels disposed in the pixel-shift layout.

In this simplified example shown in FIG. 1, thirty-two photoelectric conversion elements 22 are disposed in 8 rows×8 columns in the pixel-shift layout. A photoelectric conversion element column 20 in the odd column contains photoelectric conversion elements 22 of only the odd rows, and a photoelectric conversion element column 20 in the even column contains photoelectric conversion elements 22 of only the even rows.

In an actual IT-CCD, the number of pixels are several hundred thousands to several millions. Even in this case, the pixel-shift layout is used so that the photoelectric conversion element column 20 in the odd column contains photoelectric conversion elements 22 of only the odd rows and the photoelectric conversion element column 20 in the even column contains photoelectric conversion elements 22 of only the even rows. If the leftmost first photoelectric conversion element column 20 is omitted, the photoelectric conversion element column 20 of the odd column contains the photoelectric conversion elements 20 of only the even rows, and the photoelectric conversion element column 20 of the even column contains the photoelectric conversion elements 20 of only the odd rows.

IT-CCD shown in FIG. 1 has: a photosensitive area 10 defined on the surface area of a semiconductor substrate; an adjustment portion 60 formed outside of the photosensitive area 10; an output transfer path 70 formed outside of the adjusting portion 60; and an output unit 80 continuously formed at one end of the output transfer path 70.

Formed on the surface of the semiconductor substrate 1 in the photosensitive area 10 are eight photoelectric conversion element columns 20, eight photoelectric conversion element rows 21, four vertical transfer CCDs 30 and thirty two readout gate regions 40.

Each photoelectric conversion element column 20 is constituted of four photoelectric conversion elements 22 made of the n-type region in the p-type well, and each photoelectric conversion element row 21 is also constituted of four photoelectric conversion elements 22.

Each vertical transfer CCD 30 has one charge transfer channel (not shown in FIG. 1) made of the n-type region in the p-type well formed in the surface of the semiconductor substrate 1, five transfer electrodes 32 formed on an electric insulating film over the semiconductor substrate 1 and traversing in plan view the charge transfer channels, and four transfer electrodes 33 formed on the electric insulating film over the semiconductor substrate 1 and traversing in plan view the charge transfer channels. For example, the transfer electrodes 32 are made of a first polysilicon layer, and the transfer electrodes 33 are made of a second polysilicon layer. These transfer electrodes 32 and 33 are formed alternatively along the charge transfer channel.

Each readout gate region 40 is contiguous to both the corresponding photoelectric conversion element 22 and the corresponding area of the charge transfer channel constituting the vertical transfer CCD 30 corresponding to the photoelectric conversion element 22. In FIG. 1, each of the readout gate regions 40 is hatched for easy visual discrimination.

The adjusting portion 60 has twelve charge transfer stages connected to one ends (downstream ends) of the charge transfer channels constituting the vertical transfer CCDs 30. Each charge transfer stage is constituted of an adjusting charge transfer channel (not shown) continuous with the charge transfer channel and one of three transfer electrodes 61, 62 and 63 formed on the semiconductor substrate 1 and traversing in plan view the adjusting charge transfer channel. The charge transfer stage is formed at each crossing area between each adjusting charge transfer channel and each transfer electrode 61, 62, 63.

The transfer electrode 61 has a transfer path forming area 61T at each crossing area in plan view with each adjusting charge transfer channel. These transfer path forming areas 61T are connected together by connection areas 61C. The transfer electrode 62 has a transfer path forming area 62T at each crossing area in plan view with each adjusting charge transfer channel. These transfer path forming areas 62T are connected together by connection areas 62C. The transfer electrode 63 has a transfer path forming area 63T at each crossing area in plan view with each adjusting charge transfer channel. These transfer path forming areas 63T are connected together by connection areas 63C. As will be later described, each of the transfer electrodes 32 and 33 in the photosensitive area 10 has a similar structure to that of the transfer electrode 61, 62, or 63.

Each adjusting charge transfer channel extends along a direction traversing the transfer electrodes 61, 62, 63 in plan view at the transfer path forming areas 61T, 62T, 63T.

The transfer electrode 32, 33 and the transfer electrodes 61, 62 and 63 are drawn in FIG. 1 spaced apart from each other so as to facilitate visual discrimination therebetween. However, in actual, the transfer electrode 32 nearest to the adjusting portion 60 and the transfer electrode 61 are partially overlapped at least at the boundary thereof. The transfer electrodes 32 and 33, and the transfer electrodes 61 and 62, 62 and 63 are similarly overlapped. These transfer electrodes are electrically insulated from each other by electric insulating films.

The adjusting portion 60 includes the charge transfer stage for adjusting the charge transfer direction from that of the vertical transfer CCD 30 to the photoelectric conversion element column direction. In the example shown in FIG. 1, the charge transfer stage constituted of the transfer path forming area 61T corresponds to such an adjusting charge transfer stage.

The output transfer path 70 receives signal charges supplied from each vertical transfer CCD 30 via the adjusting portion 60, and sequentially transfers the signal charges to the output unit 80 along the lengthwise direction of the photoelectric conversion element row 21.

The output unit 80 converts the signal charges supplied from the output transfer path 70 into a voltage signal by using a floating capacitor (not shown). The signal charges after detection (conversion) are drained in a power source (not shown) via an unrepresented reset transistor.

Four pulse supply terminals 85a, 85b, 85c and 85d are disposed outside of the photosensitive area 10 in order to supply predetermined drive pulses to the transfer electrodes 32 and 33 and transfer electrodes 61, 62, and 63.

Each of the pulse supply terminals 85a, 85b, 85c, and 85d is electrically connected to every fourth electrode among the transfer electrodes 32, 33, 61, 62 and 63. Four-phase drive pulses are supplied from the pulse supply terminals 85a, 85b, 85c, and 85d to the transfer electrodes 32, 33, 61, 62 and 63.

Two pulse supply terminals 88a and 88b are disposed outside of the photosensitive area 10 to supply predetermined drive pulses to the output transfer path 70.

Reference numeral 51 shown in FIG. 1 represents an opening formed through a light shielding film 50 to be later described.

The structure of the light shielding area 10 will be described with reference to FIGS. 2, 3, 4, 5, 6A and 6B, by taking as an example the n-type silicon semiconductor substrate 1 with the p-type well. The invention is not limited only to this structure.

Figure 2:
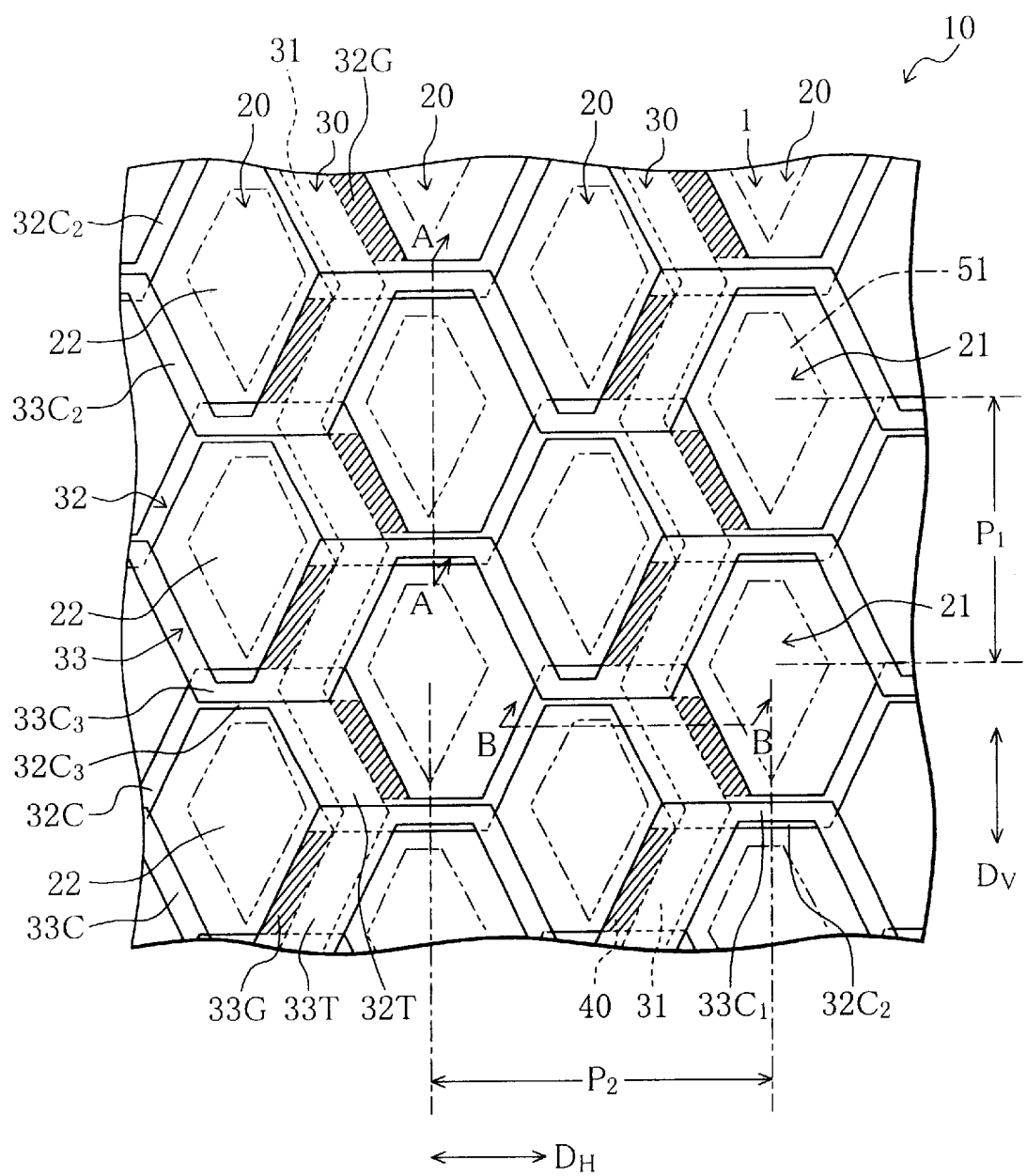
FIG. 2 is an enlarged plan view partially showing a photosensitive area of IT-CCD shown in FIG. 1.
Figure 3:
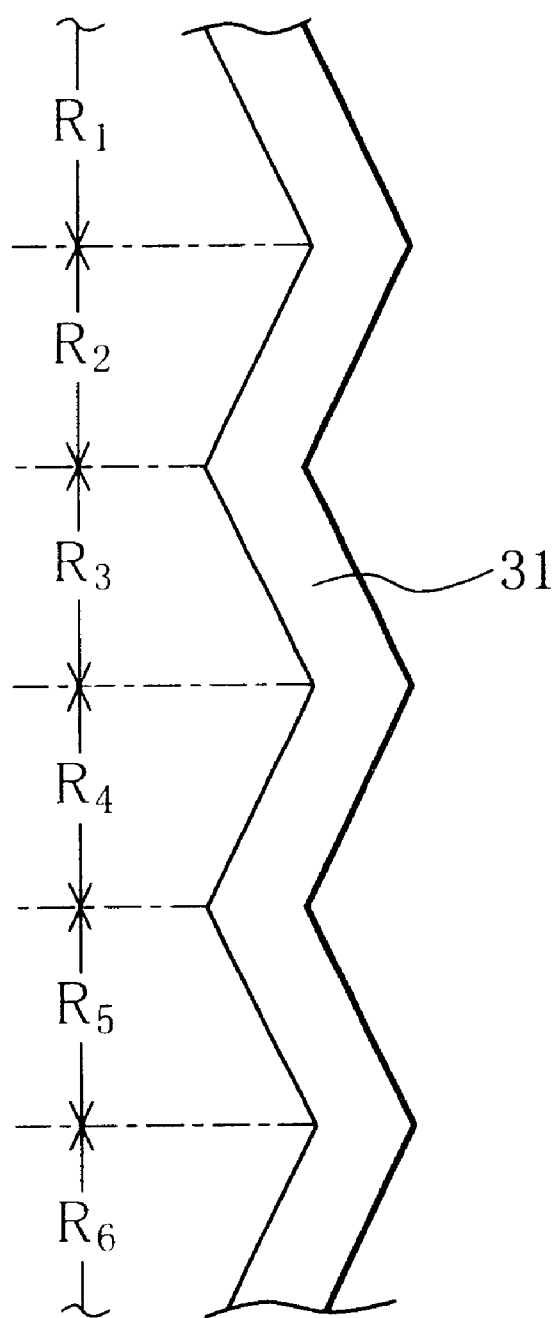
FIG. 3 is a schematic plan view showing one charge transfer channel 31 shown in FIG. 2.
Figure 4:
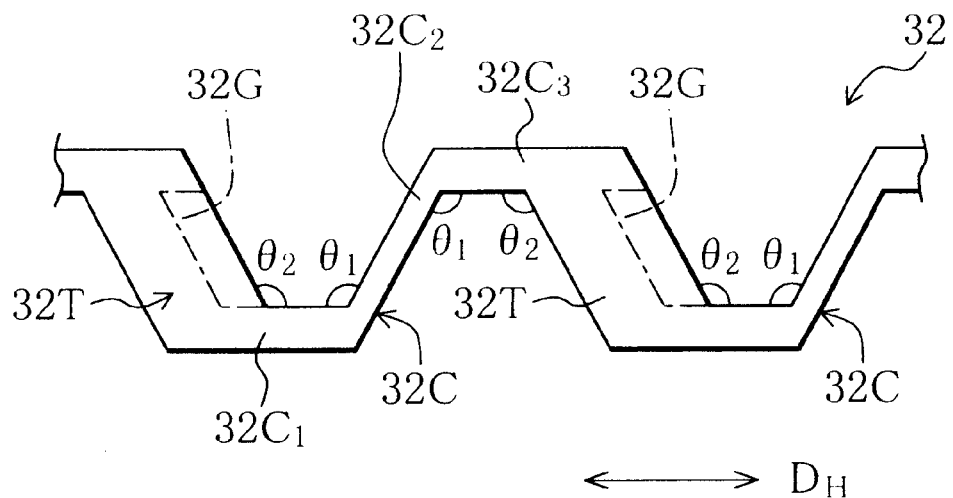
FIG. 4 is a schematic plan view showing one transfer electrode 32 shown in FIG. 2.
Figure 5:
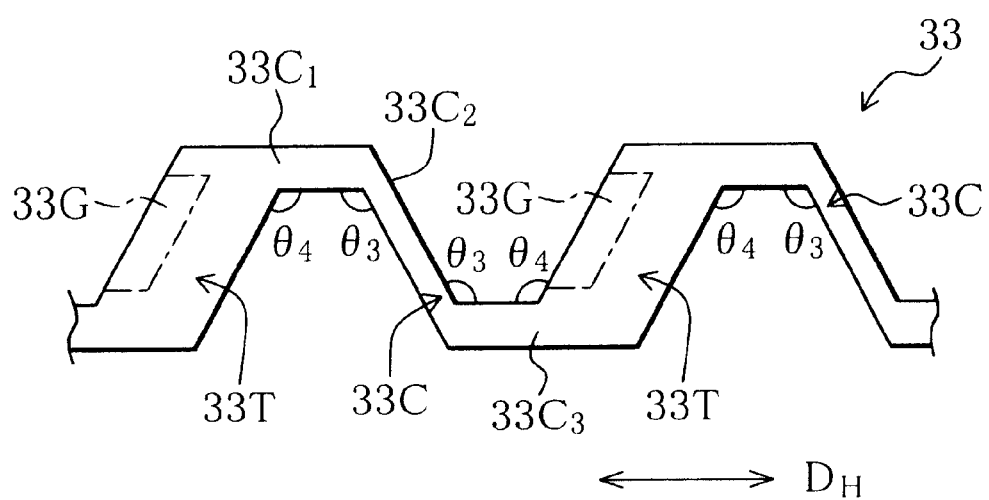
FIG. 5 is a schematic plan view showing one transfer electrode 33 shown in FIG. 2.
Figure 6A:
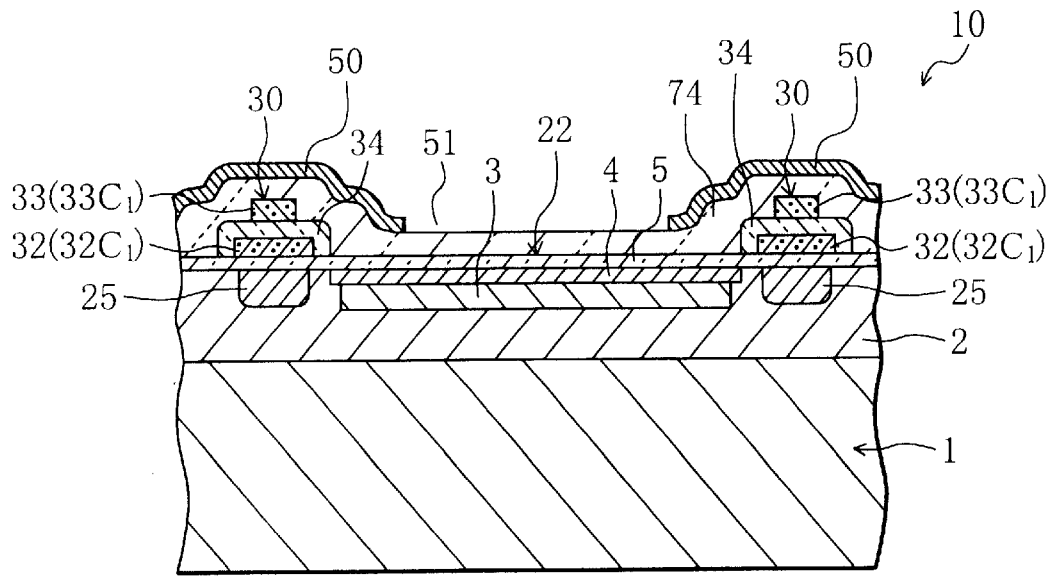
FIG. 6A is a schematic cross sectional view taken along line A—A shown in FIG. 2.
Figure 6B:
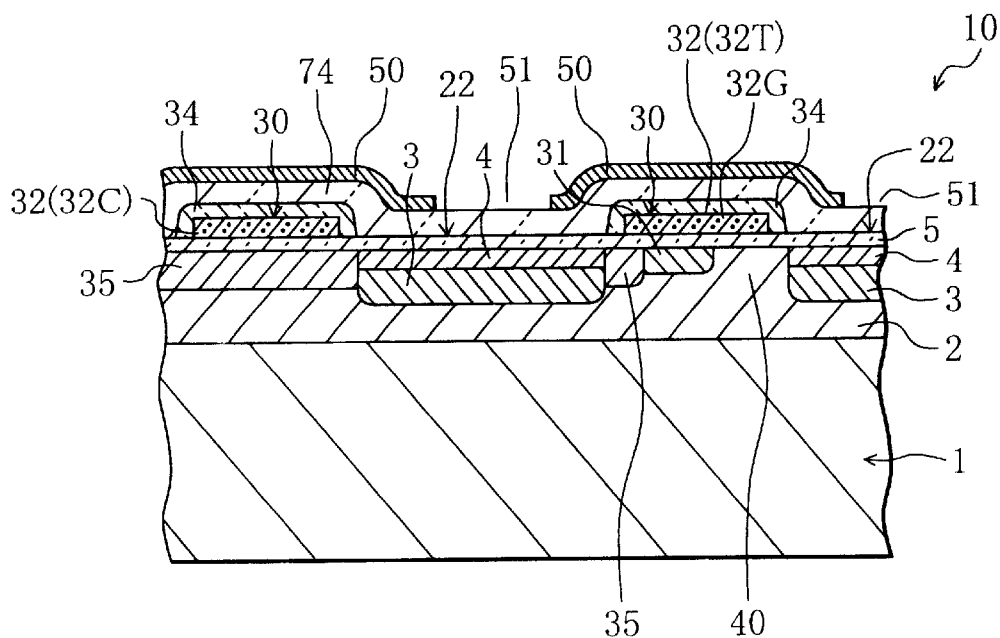
FIG. 6B is a schematic cross sectional view taken along line B—B shown in FIG. 2.

FIG. 2 is an enlarged plan view partially showing the photosensitive area 10 shown in FIG. 1, and FIG. 3 is a schematic plan view of a charge transfer channel 31 shown in FIG. 2. FIG. 4 is a schematic plan view of a transfer electrode 32, and FIG. 5 is a schematic plan view of a transfer electrode 33. FIG. 6A is a schematic cross sectional view taken along line A—A shown in FIG. 2, and FIG. 6B is a schematic cross sectional view taken along line B—B shown in FIG. 2.

As shown in FIG. 2, in each photoelectric conversion element column 20 in the photosensitive area 10, a predetermined number of photoelectric conversion elements 22 (signal charge accumulation regions) are formed to be aligned in a predetermined direction $D_V$ (indicated by an arrow in FIG. 2) at a constant pitch $P_1$. In each photoelectric conversion element row 21, a predetermined number of photoelectric conversion elements 22 (signal charge accumulation regions) are formed to be aligned in a predetermined direction $D_H$ (indicated by an arrow in FIG. 2) at a constant pitch $P_2$.

A plurality of photoelectric conversion elements 22 (signal charge accumulation regions) constituting an even column 20 are shifted in the column direction (direction $D_V$) by about a half of the pitch $P_1$, from the photoelectric conversion elements 22 constituting an odd column 20 (refer to FIG. 2). Similarly, a plurality of photoelectric conversion elements 22 (signal charge accumulation regions) constituting an even row 21 are shifted in the row direction (direction $D_H$) by about a half of the pitch $P_2$, from the photoelectric conversion elements 22 constituting an odd column 20 (refer to FIG. 2).

In this specification, "about a half of the pitch $P_1$" is intended to include not only a value $P_1/2$ but also those values different from but near $P_1/2$, the difference being ascribed to manufacture errors, round errors of a pixel position resulted from design or mask manufacture, or other errors, as far as they can be considered substantially equivalent to $P_1/2$ in terms of the IT-CCD performance and its image quality. This is also applied to "about a half of the pitch $P_2$" in this specification.

The shape of each photoelectric conversion element 22 is substantially hexagonal in plan view, the size of each photoelectric conversion element 22 are substantially the same in plan view.

One charge transfer channel 31 is provided for two photoelectric conversion element columns 20, and formed in a surface of the semiconductor substrate 1 between the two photoelectric conversion element columns 20.

As shown in FIGS. 2 and 3, each charge transfer channel 31 has a plurality of sections lying in a line. Each section has a direction different from that of the next section such that the charge transfer channel 31 shows a zigzag shape with the sections being continuous along the direction $D_V$ as a whole. $R_1, R_2, \ldots R_6$ in FIG. 3 represent the sections of the charge transfer channel 31.

Two kinds of transfer electrodes 32 and 33 are formed traversing each charge transfer channel 31 (refer to FIG. 2).

As shown in FIG. 4, each transfer electrode 32 has a predetermined number of transfer path forming areas 32T and a predetermined number of connection areas 32C having a width narrower than that of the transfer path forming area 32T. The total number of transfer path forming areas 32T of the transfer electrode 32 is the same as that of charge transfer channels 31 formed in the photosensitive area 10. The connection area 32C is constituted of a first connection area $32C_1$, a second connection area $32C_2$ and a third connection area $32C_3$. The first and third connection areas 32C, and $32C_3$ extend in the direction $D_H$. The second connection area $32C_2$ obliquely extends from one end of the first connection area 32C, to one end of the third connection area $32C_3$ and has an obtuse angle $\theta_1$ relative to the first and third connection areas $32C_1$, and $32C_3$.

A transfer path forming area 32T is continuous with the left end (left end in FIGS. 2 and 4) of a first connection area $32C_1$, and has an obtuse angle $\theta_2$ relative to the first connection area $32C_1$. The transfer path forming area 32T is continuous with the right end (right end in FIGS. 2 and 4) of a third connection area $32C_3$ of another connection area 32 and has the obtuse angle $\theta_2$ relative to the third connection area $32C_3$.

As shown in Fig. 2, each transfer path forming area 32T covers in plan view one section of the charge transfer channel 31. The transfer path forming area and section constitute one charge transfer stage. Each transfer path forming area 32T also covers in plan view a readout gate region 40. A partial region of the transfer path forming area 32T covers in plan view the readout gate region 40 constitutes a readout gate electrode structure 32G (refer to FIG. 4) for reading signal charges from the photoelectric conversion element 22.

As shown in FIG. 5, each transfer electrode 33 has a predetermined number of transfer path forming areas 33T and a predetermined number of connection areas 33C having a width narrower than that of the transfer path forming area 33T. The total number of transfer path forming areas 33T of the transfer electrode 33 is the same as that of charge transfer channels 31 formed in the photosensitive area 10. The connection area 33C is constituted of a first connection area $33C_1$, a second connection area $33C_2$ and a third connection area $33C_3$. The first and third connection areas $33C_1$ and $33C_3$ extend in the direction $D_H$. The second connection area $33C_2$ obliquely extends from one end of the first connection area $33C_1$ to one end of the third connection area $33C_3$ and has an obtuse angle $\theta_3$ relative to the first and third connection areas $33C_1$ and $33C_3$.

A transfer path forming area 33T is continuous with the left end (left end in FIGS. 2 and 4) of a first connection area $33C_1$ of a connection area 33C and has an obtuse angle $\theta_4$ relative to the first connection area $33C_1$. The transfer path forming area 33T is continuous with the right end (right end in FIGS. 2 and 4) of a third connection area $33C_3$ of another connection area 33C and has the obtuse angle $\theta_4$ relative to the third connection area $33C_3$.

As shown in FIG. 2, each transfer path forming area 33T covers in plan view one section of the charge transfer channel 31. The transfer path forming area and section constitute one charge transfer stage. Each transfer path forming area 33T also covers in plan view a readout gate region 40. A partial region of the transfer path forming area 33T covering the readout gate region 40 constitutes a readout gate electrode structure 33G (refer to FIG. 4) for reading signal charges from the photoelectric conversion element.

One vertical transfer CCD 30 (refer to FIG. 2) is composed of the charge transfer stages constituted of the transfer path forming areas 32T and the charge transfer stages constituted of the transfer path forming areas 33T connected alternately. Each charge transfer stage of the vertical transfer CCD 30 has a different direction from that of the next charge transfer stage, and the charge transfer stages extend as a whole along the direction $D_V$ (refer to FIG. 2). The vertical transfer CCD 30 transfers in the direction $D_V$ signal charges accumulated in the photoelectric conversion elements 22 constituting two photoelectric conversion element columns 20 disposed on both sides of the vertical transfer CCD 30.

Adjacent two transfer electrodes 32 and 33 overlap at the connection areas $32C_1$ and $33C_1$ or connection areas $32C_3$ and $33C_3$ when they traverse the photoelectric conversion element column 20. When they traverse the next photoelectric conversion element column 20, they separate and surround the photoelectric conversion element 22 constituting the next photoelectric conversion element column 20. The adjacent two transfer electrodes 32 and 33 extend along the direction $D_H$ as a whole by repeating the above described overlap and separation (refer to FIG. 2).

In the structure shown in FIG. 1, an upper transfer electrode 32 and a lower adjacent transfer electrodes 33 surround in plan view the photoelectric conversion elements 22 in an odd row. An upper transfer electrode 33 and lower transfer electrodes 32 surround in plan view the photoelectric conversion elements 22 in an even row.

The adjacent two transfer electrodes 32 and 33 surround one photoelectric conversion element 22 in isolated state and define one photoelectric conversion element region having a hexagonal shape. The shapes, sizes and directions of these photoelectric conversion element areas are substantially the same. Namely, the transfer electrodes 32 and 33 form a honeycomb shape (refer to FIG. 2).

The "hexagonal shape" used in this specification is intended to mean a hexagon (including a regular hexagon) with all internal angles having an obtuse angle, defined by an area surrounded by the adjacent two transfer electrodes 32 and 33. The hexagon includes a shape having rounded corners of a hexagon, a heptagon obtained by shifting one side of a hexagon to inner or outer side thereof and linking the side with adjacent two sides, an octagon obtained by shifting two sides of a hexagon to inner or outer side thereof and linking the sides with adjacent sides, or a shape having rounded corners of the heptagon or octagon. Each photoelectric conversion element 22 is positioned in plan view in the photoelectric conversion element region having the "hexagonal shape".

Each photoelectric conversion element region in the photoelectric conversion element column 20 in the odd columns as counted from the leftmost column in FIG. 1 is defined in plan view by one connection area 32C and the next right transfer path forming area 32T and by one connection area 33C and the next right transfer path forming area 33T.

Each photoelectric conversion element region in the photoelectric conversion element column 20 in the even columns as counted from the leftmost column in FIG. 1 is defined in plan view by one transfer path forming area 32T and the next right connection area 32C and by one transfer path forming area 33T and the next right connection area 33C.

The transfer electrodes 32 and 33 are drawn separated in FIG. 1 to facilitate visual discrimination therebetween. However, in practice, these transfer electrodes 32 and 33 are overlapped at the connection areas $32C_1$ and $33C_1$, at the connection areas $32C_3$ and $33C_3$ and at the transfer path forming areas 32T and 33T.

Each photoelectric conversion element 22 constituting the photoelectric conversion element column 20 at the right end in the photosensitive area 10 (right end in FIG. 1) may not be surrounded by the adjacent two transfer electrodes 32 and 33. Namely, the right end connection areas 32C and 33C necessary for surrounding in plan view each photoelectric conversion element 22 constituting the right end photoelectric conversion element column 20 may be omitted (refer to FIG. 1). This is also applicable to each photoelectric conversion element 22 constituting the left end photoelectric conversion element column 20 in the photosensitive area 10.

As shown in FIGS. 6A and 6B, the photoelectric conversion element 22 is a buried type photodiode constituted of a predetermined region of a p-type well 2 formed in one principal surface of a semiconductor substrate 1, an n-type region 3 formed in the predetermined region of the p-type well 2, and a burying $p^+$-type layer 4. The n-type region 3 functions as the signal charge accumulation region.

An electric insulating film (silicon oxide film) 5 is formed on the $p^+$-type layer 4. The electric insulating film (silicon oxide film) 5 covers not only the $p^+$-type layer 4 but also a surface of the semiconductor substrate 1. The material of the electric insulating film 5 may be a silicon oxide film, a two-layer film of a silicon oxide film and a silicon nitride film, a three-layer film of a silicon oxide film, a silicon nitride film and a silicon oxide film, or the like.

Adjacent two photoelectric conversion elements 22 along the direction $D_V$ are separated, for example, by a channel stop region 25 made of a $p^+$-type layer (refer FIG. 6A).

The charge transfer channel 31 is formed, for example, by forming an n-type region in a predetermined area of the p-type well 2 formed in the principal surface of the semiconductor substrate 1. The charge transfer channel 31 and photoelectric conversion element 22 are separated, for example, by a channel stop region 35 made of the p+-type layer, excepting the area where the readout gate region 40 is formed (refer to FIG. 6B).

The transfer electrode 32 is made of a polysilicon layer formed on an electric insulating film (silicon oxide film) 5 on the semiconductor substrate 1. Each transfer electrode 32 is covered with an electric insulating layer 34 such as a silicon oxide film. The transfer electrode 33 is also made of a polysilicon layer. Each transfer electrode 33 is covered with an electric insulating layer such as a silicon oxide film, if necessary.

Each readout gate region 40 (refer to FIG. 6B) is formed of a predetermined area of the p-type well 2 formed in the principal surface of the semiconductor substrate 1. Readout gate electrode structures 32G and 33G are formed on the electric insulating film (silicon oxide film) 5 on the readout gate regions 40 (refer to FIG. 2).

An electric insulating film (passivation film) 74 coves an exposed surface of the electric insulating film 5, an exposed surface of the electric insulating layer 34 and transfer electrodes 33. A light shielding film 50 to be later described is formed on the electric insulating film (passivation film) 74. The electric insulating film 74 covers the transfer electrodes 32 and 33 and electrically insulates the electrodes 32 and 33 from the light shielding film 50. The material of the electric insulating film 74 may be a silicon oxide film, a two-layer film of a silicon oxide film and a silicon nitride film, a three-layer film of a silicon oxide film, a silicon nitride film and a silicon oxide film, or the like.

Reference numeral 51 in FIGS. 1, 2, 6A and 6B represents the opening formed through the light shielding film 50.

In IT-CCD 100 having the above-described photosensitive area 10, one pixel includes: (a) one photoelectric conversion element 22; (b) two charge transfer stages formed adjacent to the photoelectric conversion element 22, the charge transfer stages including the charge transfer stage constituted of the transfer path forming area 32T and the charge transfer stage constituted of the transfer path forming area 33T; and (c) one readout gate region 40 formed between the photoelectric conversion element 22 and the charge transfer stage constituted of the charge transfer forming area 32T or 33T.

As described earlier, an area from the photosensitive area 10 to the output transfer path 70 of IT-CCD is covered in plan view with the light shielding film 50 to prevent unnecessary photoelectric conversion by the vertical transfer CCDs 30.

As shown in FIGS. 6A and 6B, the light shielding film 50 has an opening 51 of a predetermined shape on each photoelectric conversion element 22 in the photosensitive area 10. One opening 51 is formed for one photoelectric conversion element 22. The inner edge of the opening 51 is inner in plan view than the outer edge, in plan view, of the signal charge accumulation region (n-type region 3) of the photoelectric conversion element 22. The area of the photoelectric conversion element 22 exposed in plan view in the opening 51 functions as a light receiving area of each pixel (this light receiving area is hereinafter called in some cases "light receiving area 51").

The material of the light shielding film 50 is a metal thin film made of aluminum, chromium, tungsten, titan and molybdenum, an alloy thin film made of two metals of these metals, a multi-layer metal thin film made of a combination of the metal thin films or a combination of the metal thin film and the alloy thin film, or the like.

The opening (light receiving area) 51 has a pentagonal shape in plan view. The shapes, sizes and directions of these openings (light receiving areas) 51 are substantially the same.

Light incident upon the photoelectric conversion element 22 via the opening (photosensitive area) 51 is photoelectrically converted by the photoelectric conversion element 22 into signal charges. The signal charge is read from the n-type region 3 as the signal charge accumulation area of the photoelectric conversion element 22, to the vertical transfer CCD 30 via the readout gate region 40 being contiguous to the photoelectric conversion element 22. In this case, a predetermined field shift pulse is applied to the transfer electrode 32 (readout gate electrode structure 32G) or transfer electrode 33 (readout gate electrode structure 33G).

The signal charges read to the vertical transfer CCD 30 are sequentially transferred in the charge transfer stages of the vertical transfer CCD 30 and reach the output transfer path 70 via the adjusting portion 60 (refer to FIG. 1).

Figure 7:
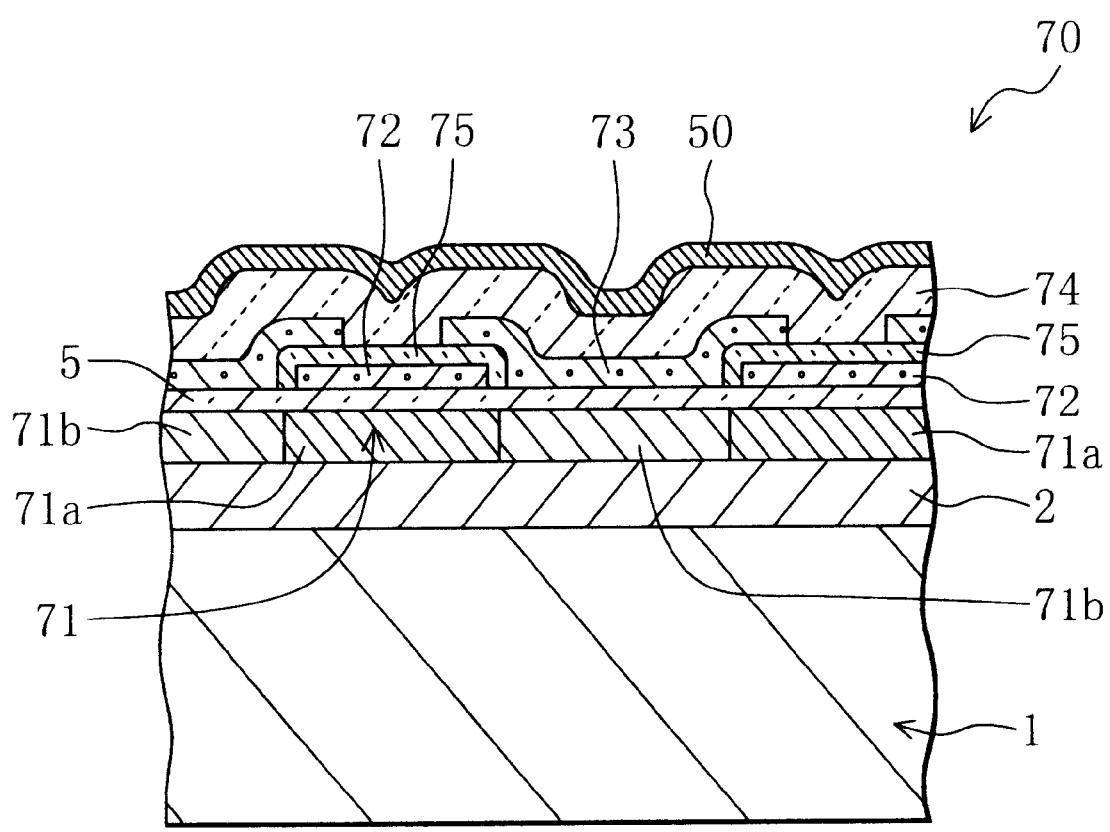
FIG. 7 is a schematic cross sectional view showing an example of a horizontal transfer CCD of IT-CCD of the first embodiment.

FIG. 7 is a schematic cross sectional view showing an example of the output transfer path 70. The output transfer path 70 shown in FIG. 7 is composed of a two-phase drive type CCD having a two-layer polysilicon electrode structure. In FIG. 7, constituent element similar to those shown in FIG. 6A or FIG. 6B are represented by using identical reference numerals, and the description thereof is omitted.

An output transfer path (horizontal transfer CCD) 70 shown in FIG. 7 has a charge transfer channel 71 formed in the surface of a semiconductor substrate 1, a plurality of transfer electrodes 72 and 73 formed on an electric insulating film (silicon oxide film) 5 on the semiconductor substrate 1, an electric insulating film (passivation film) 74 formed on the transfer electrodes 72 and 73 and a light shielding film 50 formed on the electric insulating film (passivation film) 74.

The charge transfer channel 71 is formed by alternately forming a predetermined number of n+-type regions 71a and n-type regions 71b in predetermined areas of a p-type well 2 formed in the principal surface of the semiconductor substrate 1. The n+-type region 71a contains n-type impurities at a high concentration, and the n-type region 71b contains n-type impurities at a low concentration. The charge transfer channel 71 extends along the direction $D_H$.

Each transfer electrode 72 is made of a polysilicon layer. A silicon oxide film 75 covers the surface of the transfer electrode 72. The transfer electrode 72 is formed over the n+-type region 71a. Each transfer electrode 73 is also made of a polysilicon layer. The transfer electrode 73 is formed over the n-type region 71b.

The transfer electrodes 72 and 73 traverse the charge transfer channel 71. The end portions of the transfer electrode 73 on the transfer electrode 72 side overlap the transfer electrodes 72. The transfer electrodes 72 and 73 have a so-called overlapping transfer electrode structure.

A potential well region is formed by the n+-type region 71a and the transfer electrode 72 formed on the electric insulating film (silicon oxide film) 5 over the n+-type region 71a. Similarly, a potential barrier region is formed by the n-type region 71b and the transfer electrode 73 formed on the electric insulating film (silicon oxide film) 5 over the n-type region 71b.

Both the transfer electrode 73 forming the potential barrier region and the transfer electrode 72 forming the potential well region on the next downstream side are applied with a predetermined voltage level at the same time to form one charge transfer stage.

In the output transfer path 70, two charge transfer stages are provided for one vertical transfer CCD 30. Therefore, the vertical transfer CCDs 30 are connected via the adjusting portion 60 to every two charge transfer stages of the output transfer path 70.

The signal charges transferred from the vertical transfer CCD 30 via the adjusting portion 60 are received by the output transfer path 70 in the potential well region thereof.

An electric insulating film 74 covers the transfer electrodes 72 and 73 and electrically insulates the transfer electrodes 72 and 73 from the light shielding film 50. The material of the electric insulating film 74 may be a silicon oxide film, a two-layer film of a silicon oxide film and a silicon nitride film, a three-layer film of a silicon oxide film, a silicon nitride film and a silicon oxide film, or the like.

The light shielding film 50 prevents light from entering the output transfer path 70 and the like to avoid unnecessary photoelectric conversion by the output transfer path 70 and the like.

The signal charges sequentially transferred in the output transfer path 70 eventually reach the output unit 80 (refer to FIG. 1) whereat the signal charges are converted into a voltage signal and amplified. The amplified voltage signal is output to a predetermined circuit.

In IT-CCD 100 described above, one vertical CCD 30 is provided for two photoelectric conversion element columns 20. Although only one vertical CCD 30 is provided for two photoelectric conversion element columns 20, signal charges can be read from all photoelectric conversion elements 22 of IT-CCD 100.

The number of vertical transfer CCDs of IT-CCD 100 necessary for reading signal charges from all photoelectric conversion elements 22 is a half of those of a conventional IT-CCD. The total number of charge transfer stages in the output transfer path (horizontal transfer CCD) 70 can therefore be reduced to a half of those of a conventional IT-CCD.

As a result, an IT-CCD with a large number of pixels, for example, 2 million pixels, can be manufactured without narrowing the widths of transfer electrodes of each charge transfer stage of the output transfer path 70.

In a ⅓-inch, two-million-pixel IT-CCD with the pixel-shift layout, a pitch of photoelectric conversion element columns 20 in the photosensitive area 10 is about 2 µm as described earlier. However, in IT-CCD 100 of the first embodiment, a pitch of vertical transfer CCDs 30 in the photosensitive area 10 is about 4 µm. Four transfer electrodes are formed in the region about 4 µm width of the output transfer path (horizontal transfer CCD) 70. The width of each of the transfer electrodes 72 and 73 of the output transfer path 70 can therefore be set as wide as about 1 µm.

An IT-CCD with a large number of pixels, for example, 2 million pixels, can therefore be manufactured without utilizing highly sophisticated ultra fine patterning techniques.

The total number of charge transfer stages of the output transfer path 70 can be reduced to a half of that of a conventional IT-CCD. An increase in the electrostatic capacitance of the pulse supply terminals 88a and 88b (refer to FIG. 1) to be used for supplying drive pulses to the output transfer path 70 can therefore be suppressed. An increase in the consumption power can be easily suppressed.

The shapes, sizes and directions of the photosensitive areas 51 of IT-CCD 100 are substantially the same. A light convergence efficiency and sensitivity of a pixel is not likely to have a difference between adjacent two photoelectric conversion element rows of IT-CCD 100.

In order to drive IT-CCD 100, a drive pulse supply means is used for supplying predetermined drive pulses to the transfer electrodes 32 and 33, transfer electrodes 61, 62 and 63 and output transfer path 70.

An example of a driving method will be described by taking as an example an interlace drive method for IT-CCD 100. In this example, the interlace drive method is performed by dividing one frame into four fields including first to fourth fields.

Figure 8:
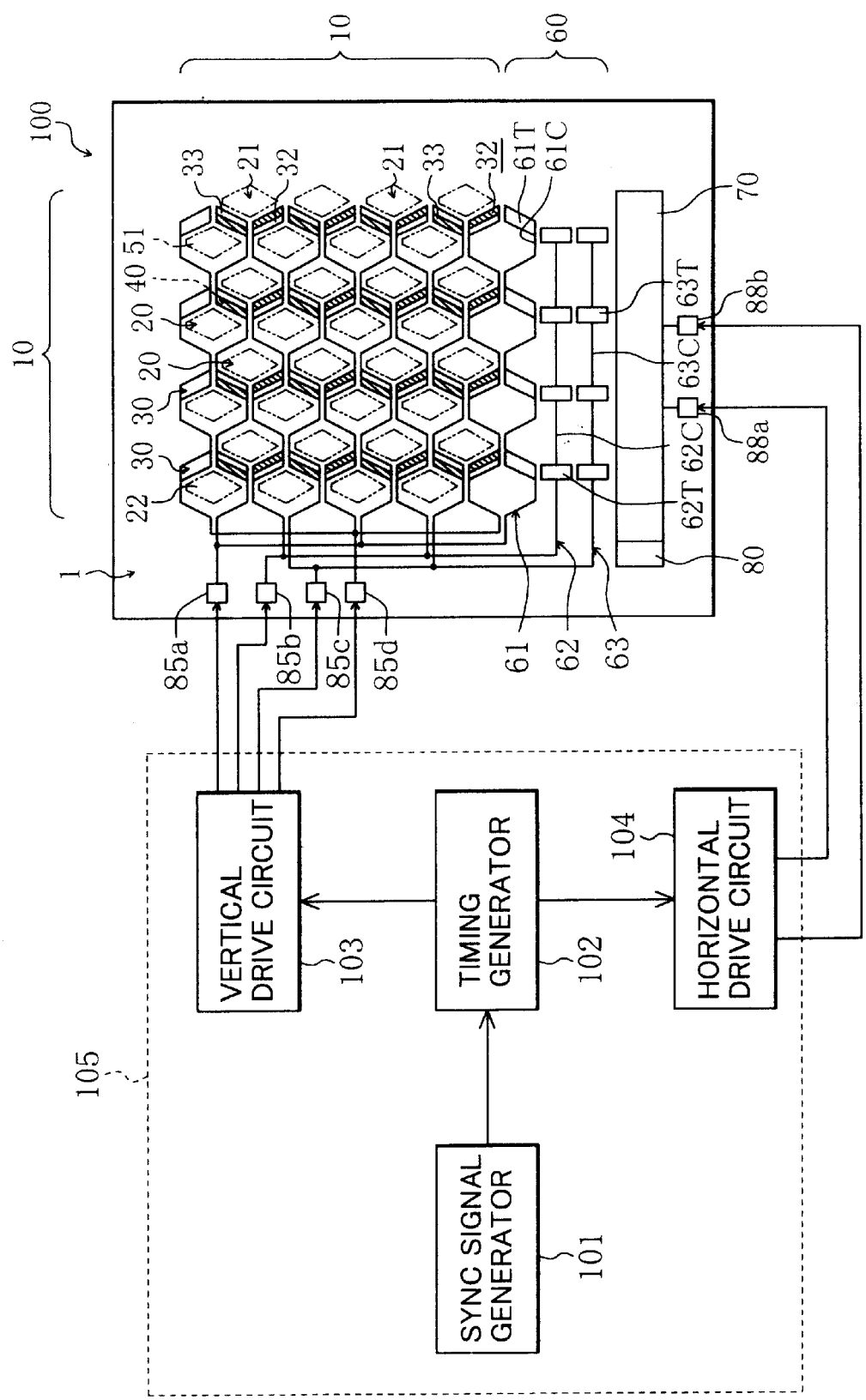
FIG. 8 is a diagram showing a connection between IT-CCD shown in FIG. 1 and drive pulse supplying means used for interlace driving of IT-CCD.

As shown in FIG. 8, a drive pulse supply means 105 for interlace-driving IT-CCD 100 includes, for example, a sync signal generator 101, a timing generator 102, a vertical drive circuit 103 and a horizontal drive circuit 104.

The sync signal generator 101 generates various pulses necessary for signal processing, such as a vertical sync pulse and a horizontal sync pulse. The timing generator 102 generates timing signals used for generating a four-phase vertical pulse signals necessary for driving the vertical transfer CCDs 30, field shift pulses necessary for reading signal charges from the photoelectric conversion elements 22, a two-phase horizontal pulse signals necessary for driving the output transfer path 70, and other pulses.

The vertical drive circuit 103 generates vertical pulse signals in response to the timing signals, and applies each vertical pulse signal to the transfer electrodes 32, 33, 61 62 or 63 via the pulse supply terminals 85a, 85b, 85c, or 85d. The horizontal drive circuit 104 generates horizontal pulse signals in response to the timing signals and applies each horizontal pulse signal to the output transfer path 70 via the pulse supply terminals 88a or 88b.

A vertical pulse signal applied to the pulse supply terminal 85a is represented by $V_a$, a vertical pulse signal applied to the pulse supply terminal 85b is represented by $V_b$, a vertical pulse signal applied to the pulse supply terminal 85c is represented by $V_c$, and a vertical pulse signal applied to the pulse supply terminal 85d is represented by $V_d$. A horizontal pulse signal applied to the pulse supply terminal 88a is represented by Ha, and a horizontal pulse signal applied to the pulse supply terminal 88b is represented by $H_b$. The phase of the horizontal pulse signal $H_a$ is shifted by 180° from that of the horizontal pulse signal $H_b$.

At a proper timing during a first vertical blanking period defined by a blanking pulse, a low level vertical pulse $V_L$ is applied to the pulse supply terminals 85a and 85b and a high level vertical pulse $V_H$ is applied to the pulse supply terminals 85c and 85d. While these vertical pulses $V_L$ and $V_H$ are applied, a higher level field shift pulse $V_R$ is applied to the pulse supply terminal 85d. Upon application of the field shift pulse $V_R$, signal charges accumulated in the photoelectric conversion elements 22 of the first and fifth pixel rows constituting the first field are read to the vertical transfer CCDs 30 (signal charge read process).

The "pixel row" means a group of pixels serially disposed in the row direction, and the pixel rows are called a first pixel row, a second pixel row, . . . , an n-th pixel row (n is a positive integer), starting from the row nearest to the output transfer path 70 (this is also applicable to IT-CCDs of other embodiments). One pixel row includes one photoelectric conversion element row 21 (refer to FIG. 1). IT-CCD 100 has eight pixel rows, the first to eighth pixel rows.

After the field shift pulse $V_R$ is applied, vertical pulse signals having a predetermined waveform $V_a$, $V_b$, $V_c$ and $V_d$ are applied to the pulse supply terminals 85a, 85b, 85c and 85d. The signal charges read to the vertical transfer CCDs 30 are therefore sequentially transferred toward the output transfer path 70.

The signal charges read from the photoelectric conversion elements 22 of the first pixel row are transferred to the output transfer path 70 during a first horizontal blanking period following the vertical blanking period. These signal charges are sequentially output from the output unit 80 during a first effective signal period following the first horizontal blanking period (image signal output process).

The signal charges read from the photoelectric conversion elements 22 of the fifth pixel row are transferred to the output transfer path 70 during a second horizontal blanking period following the first effective signal period. These signal charges are sequentially output from the output unit 80 during a second effective signal period following the second horizontal blanking period (image signal output process).

At a proper timing during a second vertical blanking period defined by the blanking pulse after the second effective signal period, the low level vertical pulse $V_L$ is applied to the pulse supply terminals 85a and 85b and the high level vertical pulse $V_H$ is applied to the pulse supply terminals 85c and 85d. While these vertical pulses $V_L$ and $V_H$ are applied, the field shift pulse $V_R$ is applied to the pulse supply terminal 85c. Upon application of the field shift pulse $V_R$, signal charges accumulated in the photoelectric conversion elements 22 of the second and sixth pixel rows constituting the second field are read to the vertical transfer CCDs 30 (signal charge read process).

The signal charges read from the photoelectric conversion elements 22 of the second pixel row are transferred to the output transfer path 70 during a third horizontal blanking period following the second vertical blanking period. These signal charges are sequentially output from the output unit 80 during a third effective signal period following the third horizontal blanking period (image signal output process).

The signal charges read from the photoelectric conversion elements 22 of the sixth pixel row are transferred to the output transfer path 70 during a fourth horizontal blanking period following the third effective signal period. These signal charges are sequentially output from the output unit 80 during a fourth effective signal period following the fourth horizontal blanking period (image signal output process).

At a proper timing during a third vertical blanking period defined by the blanking pulse after the fourth effective signal period, the high level vertical pulse $V_H$ is applied to the pulse supply terminals 85a and 85b and the low level vertical pulse $V_L$ is applied to the pulse supply terminals 85c and 85d. While these vertical pulses $V_H$ and $V_L$ are applied, the field shift pulse $V_R$ is applied to the pulse supply terminal 85b. Upon application of the field shift pulse $V_R$, signal charges accumulated in the photoelectric conversion elements 22 of the third and seventh pixel rows constituting the third field are read to the vertical transfer CCDs 30 (signal charge read process).

The signal charges read from the photoelectric conversion elements 22 of the third pixel row are transferred to the output transfer path 70 during a fifth horizontal blanking period following the third vertical blanking period. These signal charges are sequentially output from the output unit 80 during a fifth effective signal period following the fifth horizontal blanking period (image signal output process).

The signal charges read from the photoelectric conversion elements 22 of the seventh pixel row are transferred to the output transfer path 70 during a sixth horizontal blanking period following the fifth effective signal period. These signal charges are sequentially output from the output unit 80 during a sixth effective signal period following the sixth horizontal blanking period (image signal output process).

At a proper timing during a fourth vertical blanking period defined by the blanking pulse after the sixth effective signal period, the high level vertical pulse $V_H$ is applied to the pulse supply terminals 85a and 85b and the low level vertical pulse $V_L$ is applied to the pulse supply terminals 85c and 85d. While these vertical pulses $V_H$ and $V_L$ are applied, the field shift pulse $V_R$ is applied to the pulse supply terminal 85a. Upon application of the field shift pulse $V_R$, signal charges accumulated in the photoelectric conversion elements 22 of the fourth and eighth pixel rows constituting the fourth field are read to the vertical transfer CCDs 30 (signal charge read process).

The signal charges read from the photoelectric conversion elements 22 of the fourth pixel row are transferred to the output transfer path 70 during a seventh horizontal blanking period following the fourth vertical blanking period. These signal charges are sequentially output from the output unit 80 during a seventh effective signal period following the seventh horizontal blanking period (image signal output process).

The signal charges read from the photoelectric conversion elements 22 of the eighth pixel row are transferred to the output transfer path 70 during an eighth horizontal blanking period following the seventh effective signal period. These signal charges are sequentially output from the output unit 80 during an eighth effective signal period following the eighth horizontal blanking period (image signal output process).

The above operations executed during the period from the first vertical blanking period to the eighth effective signal period are repeated to sequentially output interlaced image output signals, image output signals of respective fields, from the output unit 80.

A color IT-CCD can be obtained by forming a color filter array on IT-CCD 100. A camera requiring a color image signal for each field executes a coloring signal process for each field image output signal output from the output unit 80 to obtain a color image signal of each field.

A camera requiring a color image signal for a frame temporarily stores consecutive four field image output signals in a frame memory, and executes a coloring signal process for the image output signals of one frame to obtain a color image signal for each frame. In this case, it is preferable to use a mechanical shutter in order to prevent the exposed timing of each field from being shifted. The mechanical shutter is closed after the end of the first vertical blanking period until the start of the fourth vertical blanking period so as not to enter an optical image in pixels. In this manner, the first to fourth field image output signals at the same timing can be obtained. This is applicable also to a camera requiring a black-white image signal of one frame. For a camera requiring only one frame image, the mechanical shutter is closed after the first vertical blanking period. It is therefore possible to suppress the generation of smear in the first to fourth field images.

A camera requiring color image signals for respective interlaced fields temporarily stores image output signals of a predetermined number of fields necessary for obtaining the color image signal through additive or subtractive color processes in a field memory, and executes a coloring signal process for the image output signal stored in the field memory to obtain a color image signal. In this case, one frame is divided into, for example, two fields.

If a camera requiring a color image signal of each interlaced field is realized by using IT-CCD 100 of the first embodiment, for example, the first and second fields may form a new field and the third and fourth fields may form another new field. A predetermined color filter array is formed on IT-CCD 100 in order to obtain a color image from image output signals of the first and second fields and from image output signals of the third and fourth fields.

It is preferable to use a mechanical shutter in order to prevent a shift of the exposed timing between two fields constituting one field used for obtaining a color image signal or between two fields constituting one frame. For example, the mechanical shutter is closed after the end of the first vertical blanking period until the start of the second vertical blanking period, and after the end of the third vertical blanking period until the start of the forth vertical blanking period, so as not to enter an optical image in pixels. In this manner, the field images (color images) at the same timing can be obtained.

IT-CCD 100 of the first embodiment has a simpler structure than IT-CCD practically used; micro lenses are provided to raise the photoelectric conversion efficiency of photoelectric conversion elements 22, and a color filter array is provided for color IT-CCD.

In forming micro lenses, a planarized film is formed on the photosensitive area 10. The planarized film is used also as a focus adjusting layer. For black-white IT-CCD, a micro lens array having a predetermined number of micro lenses is formed on the planarized film, and for color IT-CCD, a color filter array is formed on the planarized film and a second planarized film is formed on the color filter array to form a micro lens array on the second planarized film. For both white-black and color IT-CCDs, each micro lens covers in plan view the light receiving area of the pixel.

Figure 9A:
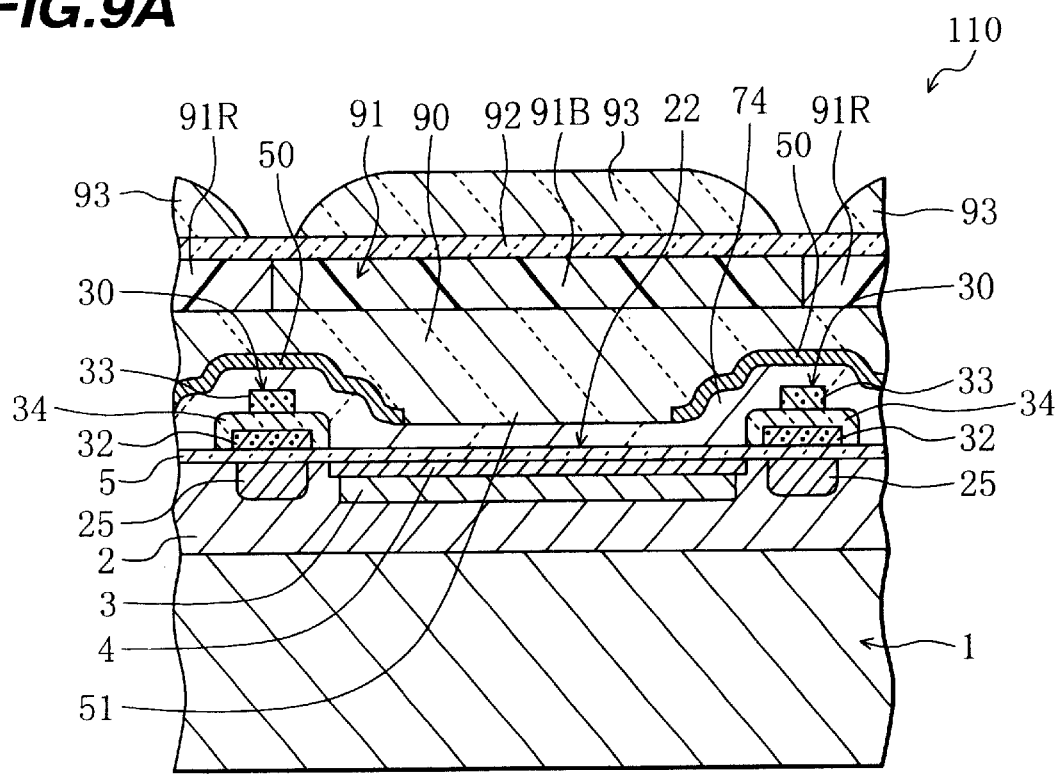
FIGS. 9A and 9B are schematic cross sectional views partially showing IT-CCD according to a second embodiment.
Figure 9B:
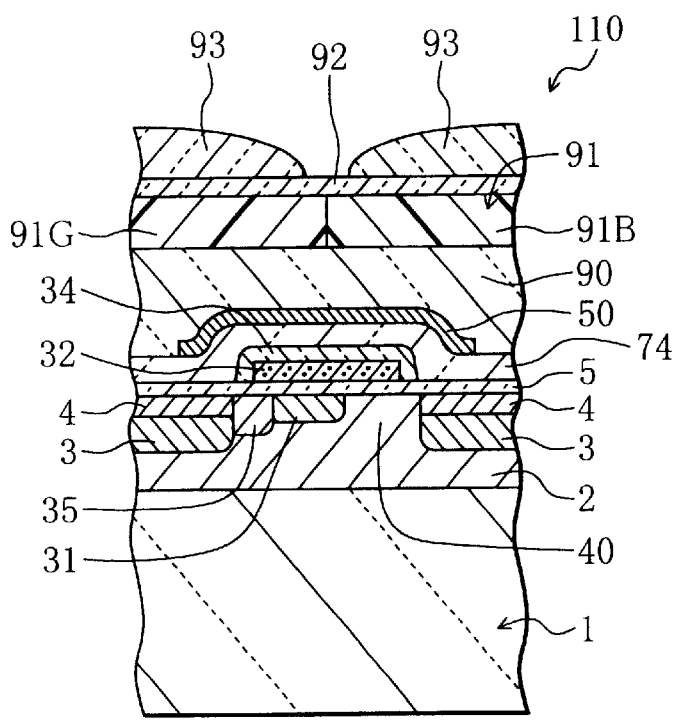

FIGS. 9A and 9B are cross sectional views partially showing IT-CCD 110 according to a second embodiment. FIGS. 9A and 9B partially show the photosensitive area of IT-CCD 110. IT-CCD 110 has a color filter array and a micro lens array added to the structure of IT-CCD 100 of the first embodiment. IT-CCD 110 is a color IT-CCD.

In FIGS. 9A and 9B, like constituent elements to those shown in FIGS. 6A and 6B are represented by using identical reference numerals, and the description thereof is omitted.

A first planarized film 90 is disposed on the light shielding film 50 formed on the electric insulating film (passivation film) 74 and on the light receiving area 51 of each pixel. A color filter array 91 is formed on the surface of the first planarized film 90. A second planarized film 92 is formed on the color filter array 91. A micro lens array having a predetermined number of micro lenses 93 is formed on the surface of the second planarized film 92.

The first planarized film 90 is formed, for example, by coating transparent resin such as photoresist to a desired thickness by a spin coating method.

The color filter array 91 has, for example, red filters 91R, green filters 91G and blue filters 91B formed in a predetermined pattern. For example, the color filter array 91 is formed by depositing a resin (color resin) pattern including desired pigment or dye by photolithography or the like.

As described with IT-CCD 100 of the first embodiment, transfer electrodes 32 and 33 are formed in a honeycomb shape. Each photoelectric conversion element 22 is positioned in plan view in a photoelectric conversion element region of a hexagonal shape or a substantially hexagonal shape defined by adjacent two transfer electrodes 32 and 33 at every second photoelectric conversion element column. The red filters 91R, green filters 91G and blue filters 91B of the color filter array 91 are disposed in a tortoise shell pattern.

The layout of color filters of the color filter array 91 is set so that full color information can be obtained through additive or subtractive color processes by using signal charges stored in photoelectric conversion elements of predetermined two pixel rows, e.g., adjacent two pixel rows, of IT-CCD having the color filter array 91.

Figure 10:
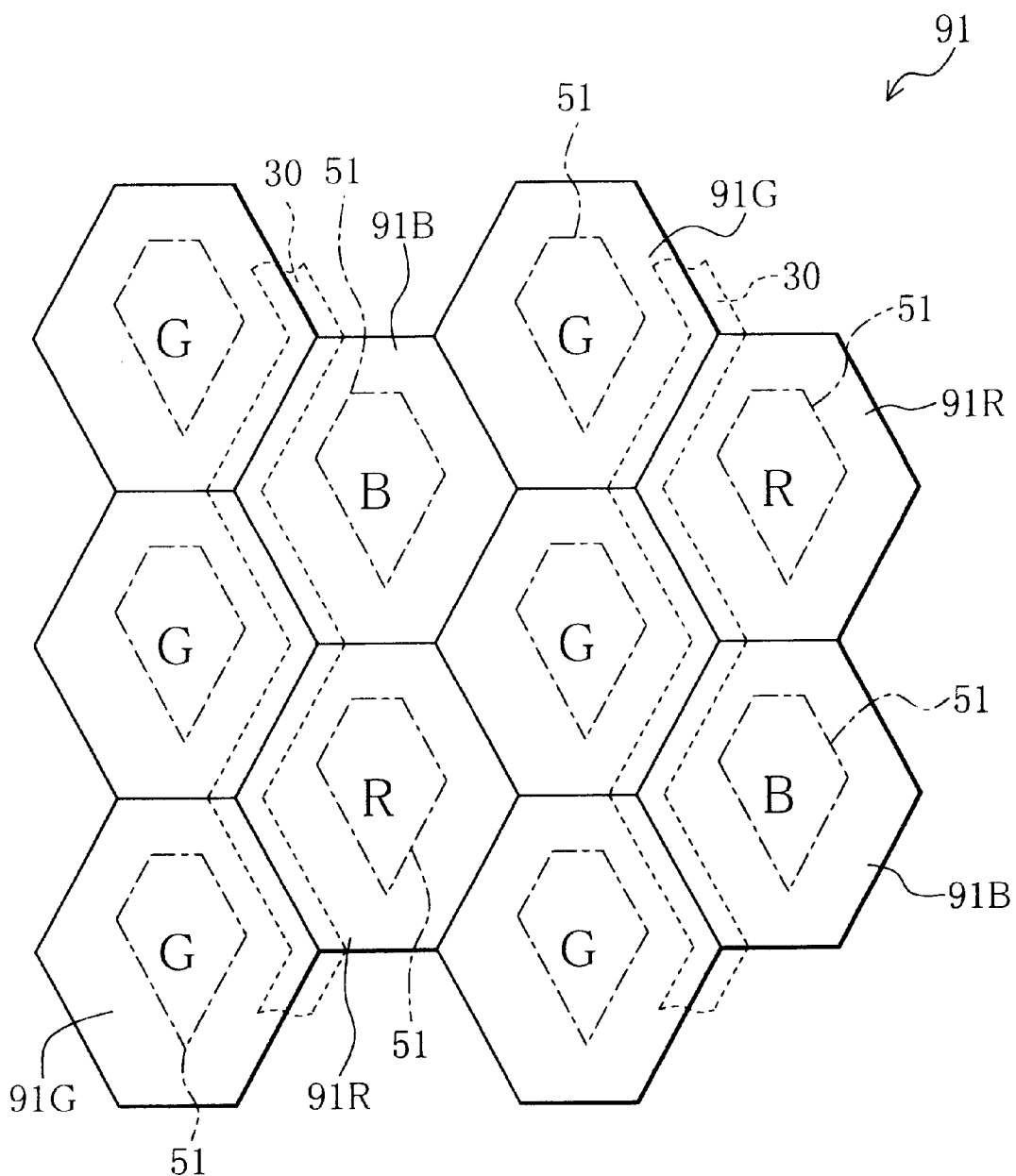
FIG. 10 is a plan view showing an example of a color filter array of IT-CCD of the second embodiment.

FIG. 10 is a partial plan view showing an example of the color filter array 91. Vertical transfer CCDs 30 are also drawn in FIG. 10. In this color filter array 91 shown in FIG. 10, a color filter column made of only green filters 91G and a color filter column made of alternately disposed blue filters 91B and red filters 91R are alternately disposed. Each vertical transfer CCD 30 is positioned under the border line between the color filter column made of only green filters 91G and the next right color filter column or color filter column made of alternately disposed blue filters 91B and red filters 91R, and extends in a zigzag way like the border line.

Each of the color filters 91R, 91G and 91B covers in plan view the light receiving area 51 of each pixel. Alphabets R, G and B of color filters shown in FIG. 10 represent colors of the color filters.

The second planarized film 92 shown in FIGS. 9A and 9B is formed, for example, by coating transparent resin such as photoresist to a desired thickness by a spin coating method.

Each micro lens 93 shown in FIGS. 9A and 9B covers in plan view the light receiving area 51 of each pixel. These micro lenses 93 are formed, for example, by forming a transparent resin (e.g., photoresist film) having a refractive index of about 1.3 to 2.0 by photolithography and partitioning it in a tortoise shell pattern, and thereafter melting each partitioned transparent resin pattern by heat treatment to round the corners, and cooling the pattern.

Similar to IT-CCD 100 of the first embodiment, IT-CCD 110 with the color filter array 91 and micro lens array has the output transfer path. In the area of the output transfer path, the first planarized film 90 is formed on the light shielding film 50 of the output transfer path 70 shown in FIG. 7, and the second planarized film 92 is formed on the first planarized film 90.

Figure 11:
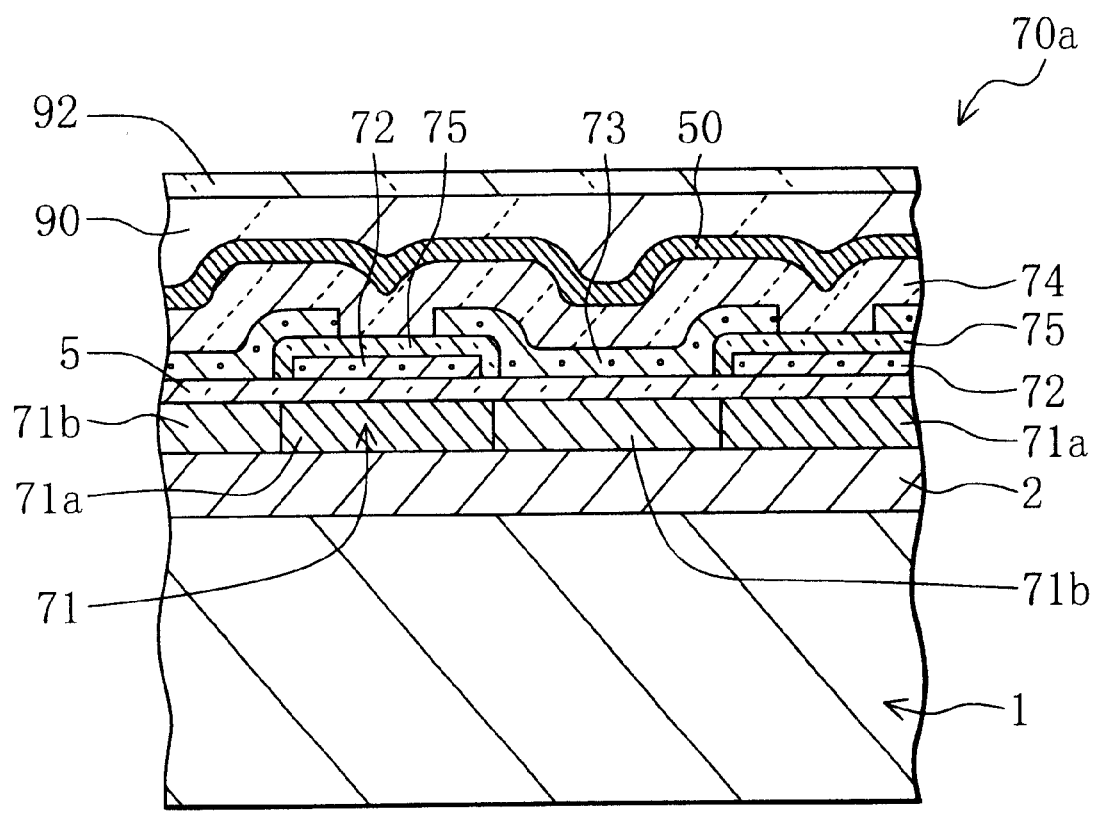
FIG. 11 is a schematic cross sectional view partially showing a horizontal transfer CCD of IT-CCD of the second embodiment.

FIG. 11 is a schematic cross sectional view showing the output transfer path 70a of IT-CCD 110. In FIG. 11, similar constituent elements to those shown in FIGS. 7, 9A and 9B are represented by using identical reference numerals, and the description thereof is omitted.

The first planarized film 90 shown in FIG. 11 is formed at the same time when the first planarized film 90 (refer to FIGS. 9A and 9B) is formed on the photosensitive area 10. The second planarized film 92 shown in FIG. 11 is formed at the same time when the second planarized film 92 (refer to FIGS. 9A and 9B) is formed on the color filter array 91.

As apparent from the layout of color filters of the color filter array 91 of IT-CCD 110 shown in FIG. 10, the green filters 91G are disposed on photoelectric conversion elements 22 of one of two adjacent pixel rows, and the blue and red color filters 91B and 91R are disposed alternately on photoelectric conversion elements 22 of the other pixel row. The blue and red filters 91B and 91R of the other pixel row may be disposed alternately in this order or reversed order.

Full color information is obtained from the signal charges of photoelectric conversion elements 22 of the pixel row having only green filters 91G and from the signal charges of photoelectric conversion elements 22 of the pixel row having blue and red color filters 91B and 91R disposed alternately.

If a light convergence efficiency and sensitivity of a pixel has a difference between adjacent two pixel rows, there is also a difference of a light convergence efficiency and sensitivity of a pixel between the pixel row having only green filters 91G and the pixel row having blue and red filters 91B and 91R disposed alternately. As a result, signal outputs obtained from signal charges accumulated in the photoelectric conversion elements of adjacent two pixel rows have a difference between a ratio of the red signal output to the green signal output and a ratio of the blue signal output to the green signal output. This difference results in a color unbalance of output signals of IT-CCD 110. A color unbalance of output signals results in color shading in a reproduced image.

The photosensitive area of IT-CCD 110 is the same as the photosensitive area 10 of IT-CCD 100, and as described earlier the shapes, sizes and directions of light receiving areas 51 formed in the photosensitive area 10 of IT-CCD 100 are substantially the same.

Although the pixel-shift layout is employed in IT-CCD 110, adjacent two pixel rows are not therefore likely to have a difference in the light convergence efficiency and sensitivity of a pixel. Color shading is also not likely to occur. It is easy to suppress a difference in the light convergence efficiency and sensitivity of a pixel.

From the same reason described with IT-CCD 100 of the first embodiment, IT-CCD 110 can easily improve the pixel density without using highly sophisticated ultra fine patterning techniques and can easily suppress an increase in power consumption.

Next, IT-CCD according to a third embodiment will be described with reference to FIG. 12.

Figure 12:
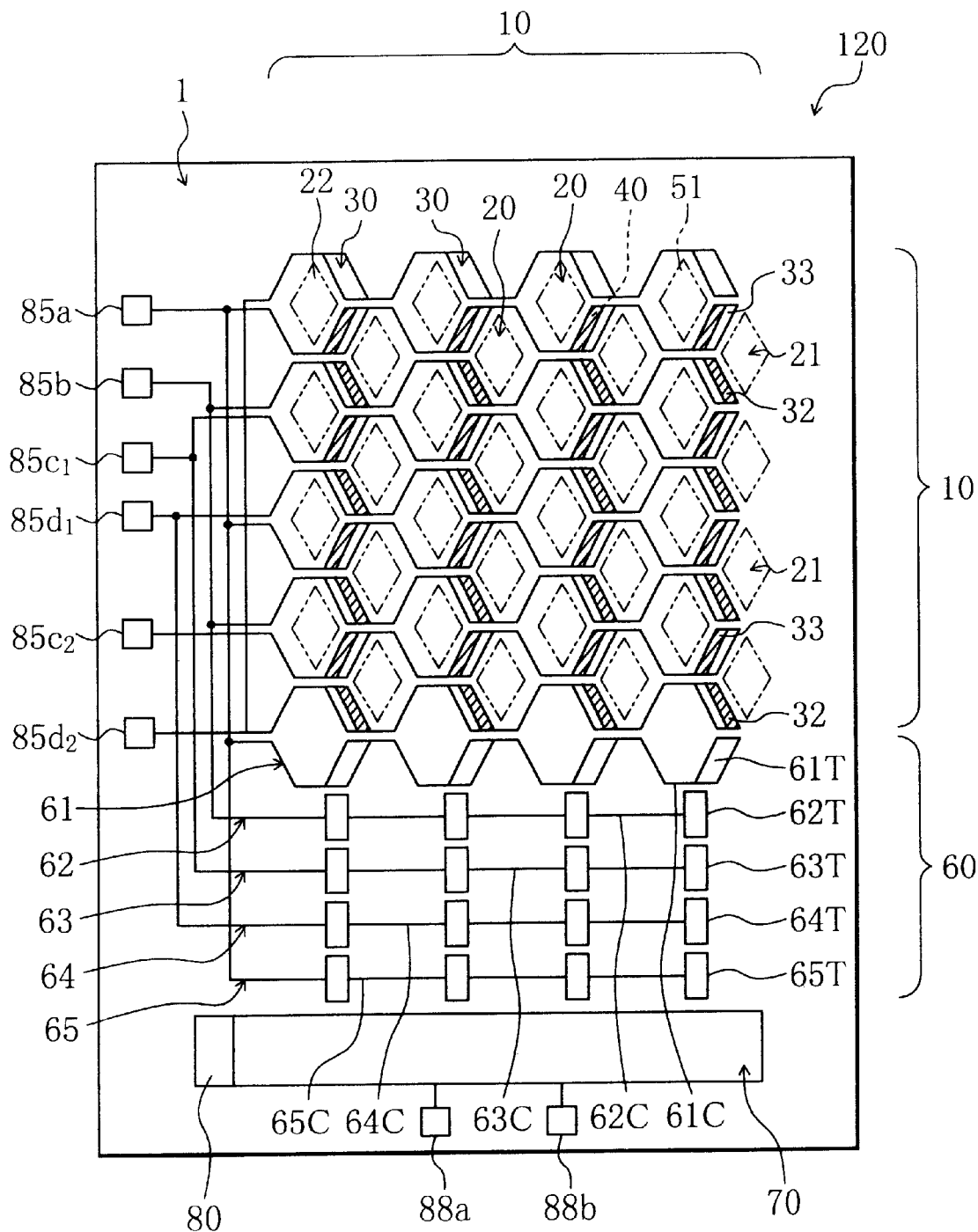
FIG. 12 is a schematic plan view showing IT-CCD according to a third embodiment.

FIG. 12 is a schematic plan view of IT-CCD 120 according to the third embodiment. IT-CCD 120 has the similar structure to that of IT-CCD 100 excepting: (i) the shape of a light receiving area of each pixel; (ii) the number of transfer electrodes constituting the adjusting portion; (iii) the number of pulse supply terminals for supplying predetermined drive pulses to the transfer electrodes constituting each vertical transfer CCD and the transfer electrodes in the adjusting portion; and (iv) a specification of interconnection between the pulse supply terminals and transfer electrodes. In FIG. 12, like constituent elements to those shown in FIG. 1 are represented by using identical reference numerals used in FIG. 1, and the description thereof is omitted.

As shown in FIG. 12, the shape of the light receiving area 51a of each pixel of IT-CCD 120 is a rhombus having a longer diagonal substantially parallel to the direction $D_v$ and a shorter diagonal substantially parallel to the direction $D_H$.

The number of charge transfer stages in the adjusting portion 60 is increased by two for each vertical transfer CCD 30. The increased charge transfer stages are formed on the downstream side of the transfer electrode 63. Each increased charge transfer stage transfers signal charges along the direction $D_v$. The increased charge transfer stages are constituted of a transfer electrode 64 or 65 having the shape same as that of the transfer electrode 63.

The transfer electrode 64 has four transfer path forming areas 64T extending in the direction $D_v$. The four transfer path forming areas 64T are connected by connection areas 64C extending in the direction $D_H$. The transfer electrode 65 has four transfer path forming areas 65T extending in the direction $D_v$. The four transfer path forming areas 65T are connected by connection areas 65C extending in the direction $D_H$. In each increased charge transfer stage, an adjusting charge transfer channel extends in the direction $D_v$.

IT-CCD 120 has six pulse supply terminals $85a$, $85b$, $85c_1$, $85c_2$, $85d_1$ and $85d_2$ to supply predetermined drive pulses to the transfer electrodes 32 and 33 and transfer electrodes 61 to 65.

The pulse supply terminals $85_1c$, and $85c_2$ are formed by dividing the pulse supply terminal $85c$ shown in FIG. 1 into two terminals. The pulse supply terminals $85d_1$, and $85d_2$ are formed by dividing the pulse supply terminal $85d$ shown in FIG. 1 into two terminals.

These pulse supply terminals $85a$, $85b$, $85c_1$, $85c_2$, $85d_1$ and $85d_2$ are electrically connected to predetermined transfer electrodes among those electrodes 32, 33, 61, 62, 63,64 and 65.

The shapes, sizes and directions of light receiving areas 51 of pixels of IT-CCD 120 shown in FIG. 12 are substantially the same. Therefore, from the same reason as that of IT-CCD 100 of the first embodiment, although the pixel-shift layout is employed, adjacent two pixel rows can be easily prevented from having a difference in the light convergence efficiency and sensitivity of a pixel.

From the same reason described with IT-CCD 100 of the first embodiment, IT-CCD 120 can easily improve the pixel density without using highly sophisticated ultra fine patterning techniques and can easily suppress an increase in power consumption.

A color IT-CCD can be formed by providing IT-CCD 120 with a color filter array. The color filter array can be formed, for example, by using a process similar to that used for forming the color filter array of IT-CCD 110 of the second embodiment.

If IT-CCD 120 is modified to a color IT-CCD, from the same reason as that described with IT-CCD 110 of the first embodiment, color shading is not likely to occur.

Similar to IT-CCD 100, IT-CCD 120 can be interlace-driven. In the interlace drive, a vertical pulse signal $V_a$ is applied to the pulse supply terminal $85a$, and a vertical pulse signal $V_b$ is applied to the pulse supply terminal $85b$. A vertical pulse signal $Vc$ is applied to the pulse supply terminals $85c_1$ and $85c_2$, and a vertical pulse signal $V_d$ is applied to the pulse supply terminals $85d_1$ and $85d_2$. A horizontal pulse signal $Ha$ is applied to the pulse supply terminal $88a$, and a horizontal pulse signal $Hb$ is applied to the pulse supply terminal $88b$.

Similar to IT-CCD 100 of the first embodiment, one frame is divided into four fields, first to fourth fields. An image signal output of each field can be obtained by an operation similar to that used for IT-CCD 100. This operation is executed for the first to fourth fields to obtain an image output signal of one frame.

IT-CCD 120 can be driven by thinning the number of pixel rows from which signal charges are read, to a quarter of the total number of pixel rows. During the thinning drive operation, at a proper timing during a first vertical blanking period defined by a blanking pulse, for example, a low level vertical pulse $V_L$ is applied to the pulse supply terminals $85a$ and $85b$ and a high level vertical pulse $V_H$ is applied to the pulse supply terminals $85c_1$, $85c_2$, $85d_1$ and $85d_2$. While these vertical pulses $V_L$ and $V_H$ are applied, a field shift pulse $V_R$ is applied to the pulse supply terminal $85d_2$.

Upon application of the field shift pulse $V_R$, signal charges accumulated in the photoelectric conversion elements 22 of the first pixel row are read to the vertical transfer CCDs 30 (signal charge read process).

Next, the vertical pulse signals $V_a$, $V_b$, $V_c$ and $V_d$ of one period are applied to each of the pulse supply terminals 85a, 85b, $85c_1$, $85c_2$, $85d_1$ and $85d_2$. The signal charges read to the vertical transfer CCDs are therefore transferred toward the output transfer path 70 by an amount corresponding to one charge transfer stage.

Thereafter, the low level vertical pulse $V_L$ is applied to the pulse supply terminals 85a and 85b and the high level vertical pulse $V_H$ is applied to the pulse supply terminals $85c_1$, $85c_2$, $85d_1$ and $85d_2$. While these vertical pulses $V_L$ and $V_H$ are applied, the field shift pulse $V_R$ is applied to the pulse supply terminal $85c_2$. Upon application of the field shift pulse $V_R$, signal charges accumulated in the photoelectric conversion elements 22 of the second pixel row are read to the vertical transfer CCDs 30 (signal charge read process).

The signal charges read from the photoelectric conversion elements 22 of the first pixel row are transferred to the output transfer path 70 during a first horizontal blanking period following the first vertical blanking period. These signal charges are sequentially output from the output unit 80 during a first effective signal period following the first horizontal blanking period (image signal output process).

The signal charges read from the photoelectric conversion elements 22 of the second pixel row are transferred to the output transfer path 70 during a second horizontal blanking period following the first effective signal period. These signal charges are sequentially output from the output unit 80 during a second effective signal period following the second horizontal blanking period (image signal output process).

The signal charges read to the vertical transfer CCDs 30 are processed in a manner similar to the process used for a usual interlace drive operation. A field image signal thinned by a quarter or a frame image signal thinned by a quarter can thus be obtained.

Similar to the thinning operation described above, the quarter thinning operation may be performed by using optional two pixel rows. A pixel row used for the quarter thinning operation can be selected as desired. In accordance with the pixel rows used for the quarter thinning operation, a specification of interconnection is determined between the pulse supply terminals 85a, 85b, $85c_1$, $85c_2$, $85d_1$, and $85d_2$ and the transfer electrodes 32 and 33 and transfer electrodes 61, 62, 63, 64, and 65. If IT-CCD 120 is modified to a color IT-CCD, a pixel row used for the thinning operation is determined while the layout of color filters of the color filter array is taken into consideration.

The above thinning operation is not to read signal charges of all pixels but to obtain image signals always thinned to a quarter of the total number of pixel rows. IT-CCD 120 shown in FIG. 12 has eight pixel rows. Therefore, only two read operations in the horizontal direction are performed for the quarter thinning operation. IT-CCD in practical use has the number of pixel rows, e.g., 600 pixel rows or more.

If the photosensitive area of IT-CCD has a structure of n-stages in the direction $D_v$, each stage has the same structure as that of the photosensitive area 10 shown in FIG. 12, the thinning operation is performed from the first stage to the n-th stage to obtain a frame image signal thinned to a quarter. In this case, signal charges are read from the photoelectric conversion elements 22 of a desired pixel row to corresponding vertical transfer CCDs at the same time at each stage. The signal charges read at each stage are sequentially transferred to the output transfer path 70 by each vertical transfer CCD 30, and transferred in the output transfer path 70 to be sequentially output from the output unit 80.

With the above quarter thinning operation, all color signals necessary for obtaining a color image through additive of subtractive color processes can be obtained during one field period. Therefore, the memory to be used for the coloring signal processes is sufficient if it has a capacity of one or two pixel rows. A field memory and a mechanical shutter are not essential.

If an optimum setting of exposure conditions (shutter time and iris), a focus adjustment, a monitor image display and the like of a digital still camera are to be performed at a time, it is necessary to obtain an image output signal at a high frame frequency of about 30 frames/sec.

For a high resolution digital still camera, it is desired to use IT-CCD having one million pixels or more.

If the number of pixels of IT-CCD exceeds one million, it takes a considerably long time such as several frames/sec to obtain an image signal output of one frame. It is therefore impossible to perform at a time an optimum setting of exposure conditions, a focus adjustment, a monitor image display and the like.

In order to realize a high resolution digital still camera, it is desired to use IT-CCD capable of performing at a high frame frequency the operation other than an operation of reading a still image recorded upon depression of a shutter.

IT-CCD 120 can perform a normal interlace drive and a quarter pixel row thinning drive. The frame frequency of the thinning drive is four times that of the normal interlace drive. IT-CCD 120 provides a structure suitable for obtaining an image signal of a high frame frequency.

Figure 13:
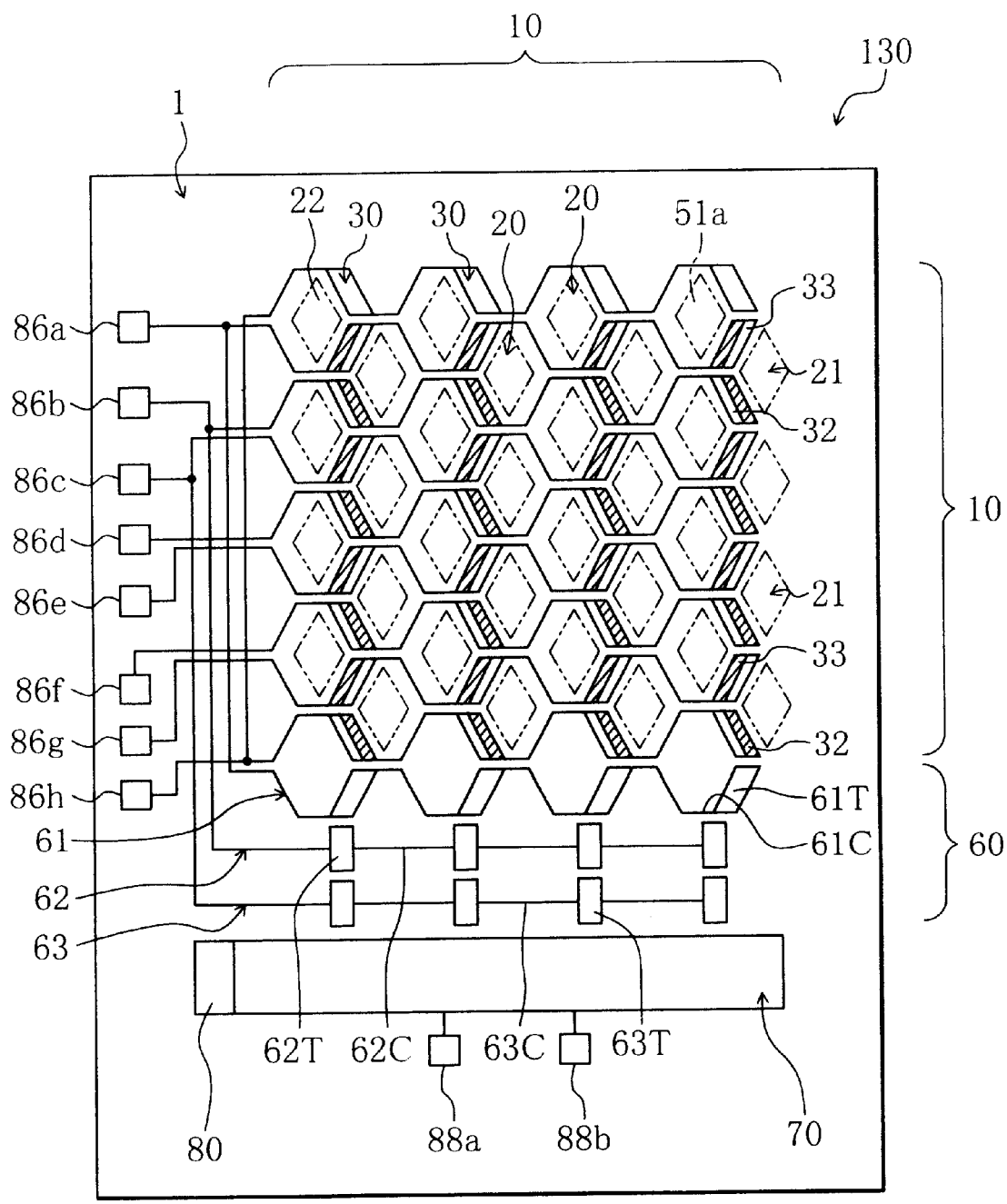
FIG. 13 is a schematic plan view showing IT-CCD according to a fourth embodiment.

Next, IT-CCD according to a fourth embodiment will be described with reference to FIG. 13. FIG. 13 is a schematic plan view of IT-CCD 130 of the fourth embodiment.

IT-CCD 130 shown in FIG. 13 has the same structure as that of IT-CCD 100 excepting: (i) the shape of a light receiving area of each pixel; (ii) the number of pulse supply terminals for supplying predetermined drive pulses to the transfer electrodes constituting each vertical transfer CCD and the transfer electrodes in the adjusting portion; and (iii) a specification of interconnection between the pulse supply terminals and transfer electrodes. In FIG. 13, like constituent elements to those shown in FIG. 1 and FIG. 12 are represented by using identical reference numerals used in FIG. 1 and FIG. 12.

As shown in FIG. 13, the shape of the light receiving area 51a of each pixel of IT-CCD 130 is a rhombus having a longer diagonal substantially parallel to the direction $D_v$ and a shorter diagonal substantially parallel to the direction $D_H$, similar to IT-CCD 120 shown in FIG. 12.

IT-CCD 130 has eight pulse supply terminals 86a, 86b, 86c, 86d, 86e, 86f, 86g and 86h to supply predetermined drive pulses to the transfer electrodes 32 and 33 and transfer electrodes 61, 62 and 63.

The pulse supply terminals 86a, 86b, 86c, 86d, 86e, 86f, 86g and 86h are electrically connected to predetermined transfer electrodes among those transfer electrodes 32, 33, 61, 62 and 63.

The shapes, sizes and directions of light receiving areas 51a of pixels of IT-CCD 130 shown in FIG. 13 are substantially the same. Therefore, from the same reason as that of IT-CCD 100 of the first embodiment, although the pixel-shift layout is employed, adjacent two pixel rows can be easily prevented from having a difference in the light convergence efficiency and sensitivity of a pixel.

From the same reason described with IT-CCD 100 of the first embodiment, IT-CCD 130 can easily improve the pixel density without using highly sophisticated ultra fine patterning techniques and can easily suppress an increase in power consumption.

A color IT-CCD can be formed by providing IT-CCD 130 with a color filter array. The color filter array can be formed, for example, by using a process similar to that used for forming the color filter array of IT-CCD 110 of the second embodiment.

If IT-CCD 130 is modified to a color IT-CCD, from the same reason as that described with IT-CCD 110 of the first embodiment, color shading is not likely to occur.

For the interlace drive of IT-CCD 130, predetermined vertical pulse signals are applied to the pulse supply terminals 86*a*, 86*b*, 86*c*, 86*d*, 86*e*, 86*f*, 86*g* and 86*h*, a horizontal pulse signal H*a* is applied to the pulse supply terminal 88*a*, and a horizontal pulse signal H*b* is applied to the pulse supply terminal 88*b*. In this manner, one frame can be divided into eight fields including the first to eighth pixel rows.

An image signal output of each field can be obtained by an operation (refer to IT-CCD 100 of the first embodiment) similar to that used for obtaining an image signal output of each field among four fields divided from one frame for the interlace drive. This operation is executed for the first to eighth fields to obtain an image output signal of one frame.

If adjacent two fields along the direction $D_v$, e.g., the third and fourth fields, are selected and the above operation is repeated, the image signal output of the predetermined two fields can always be obtained.

Each vertical transfer CCD 30 of IT-CCD 130 can be eight-phase driven. In an eight-phase drive type CCD, one potential well is formed over consecutive six to seventh charge transfer stages and signal charges accumulated in the potential well can be transferred. In a four-phase drive type CCD, one potential well is formed over consecutive two to three charge transfer stages and signal charges accumulated in the potential well can be transferred.

If the designed patterns of the transfer electrodes 32 and 33 are the same, the eight-phase drive type CCD can transfer signal charges about two to three times in amount as compared to the four-phase drive type CCD.

The channel width of the charge transfer channel of each vertical transfer CCD 30 of IT-CCD 130 can therefore be narrowed so that the area of the photoelectric conversion element 22 and the light receiving area 51*a* of each pixel can be made large correspondingly. It is therefore possible to increase the sensitivity and saturated output and the dynamic range.

A color IT-CCD can be formed by providing IT-CCD 130 with a color filter array. The color filter array can be formed., for example, by using a process similar to that used for forming the color filter array of IT-CCD 110 of the second embodiment.

A camera requiring a color image signal for each field executes a coloring process for each field image output signal output from the output unit 80 to obtain a color image signal of each field.

A camera requiring a color image signal for a frame temporarily stores consecutive eight field image output signals in a frame memory, and executes a coloring signal process for the image output signals of one frame to obtain a color image signal for each frame. In this case, it is preferable to use a mechanical shutter in order to prevent the exposed timing of each field from being shifted. The mechanical shutter is closed after the end of the first vertical blanking period until the start of the eighth vertical blanking period so as not to enter an optical image in pixels. In this manner, the first to eighth field image output signals at the same timing can be obtained. This is applicable also to a camera requiring a black-white image signal of one frame. For a camera requiring only one frame image, the mechanical shutter is closed after the first vertical blanking period. It is therefore possible to suppress the generation of smear in the first to eighth field images.

Figure 14:
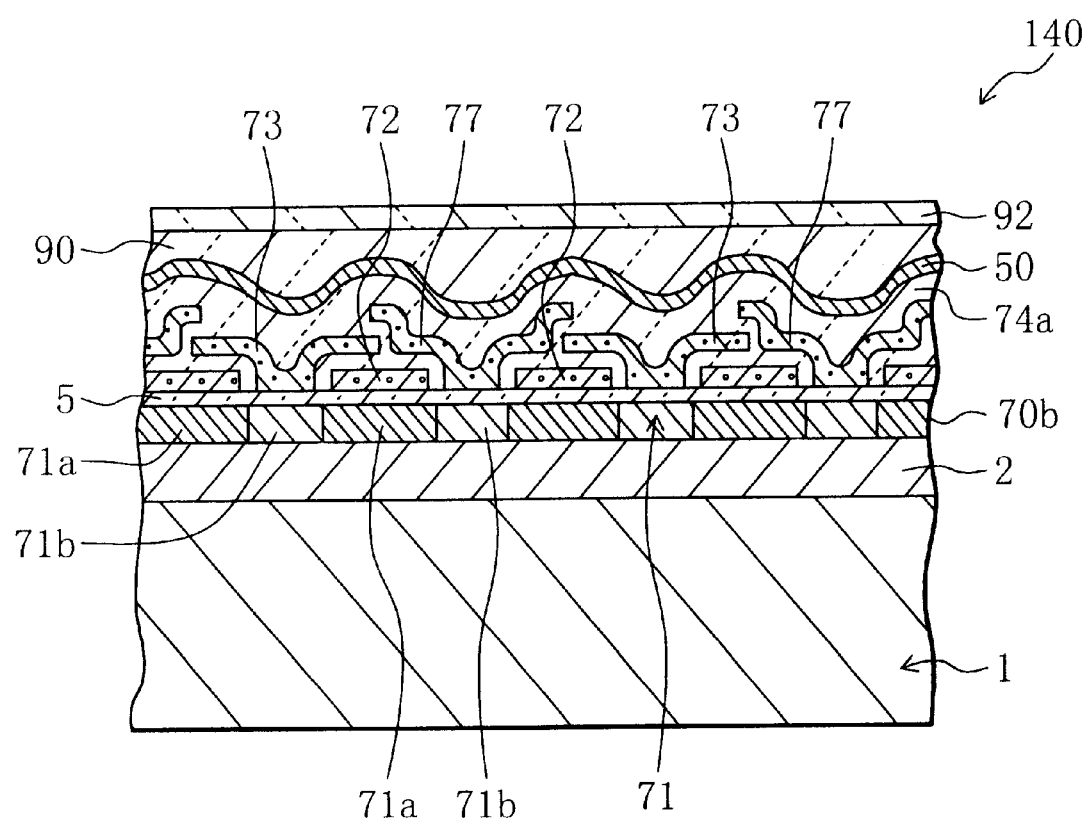
FIG. 14 is a schematic cross sectional view partially showing an output transfer path being composed of a three-layer polysilicon type CCD of IT-CCD according to a fifth embodiment.

Next, IT-CCD according to a fifth embodiment will be described with reference to FIG. 14. FIG. 14 is a schematic cross sectional view partially showing an output transfer path 70*b* of IT-CCD 140 of the fifth embodiment.

IT-CCD 140 has the same structure as that of IT-CCD 100 excepting that the output transfer path 70 of IT-CCD 100 of the first embodiment is replaced by the output transfer path 70*b* shown in FIG. 14. In FIG. 14, like constituent elements to those of the output transfer path 70*a* shown in FIG. 11 are represented by using identical reference numerals used in FIG. 11, and the description thereof is omitted.

An output transfer path 70*b* is composed of a two-phase drive type CCD having a three-layer polysilicon electrode structure. Similar to the output transfer path 70*a* of IT-CCD 110 shown in FIG. 11, the output transfer path 70*b* has a charge transfer channel 71. The charge transfer channel 71 is formed by alternately forming a predetermined number of n⁺-type regions 71*a* and n-type regions 71*b* in predetermined areas of a p-type well 2 formed in the principal surface of a semiconductor substrate 1. The n⁺-type region 71*a* contains n-type impurities at a high concentration, and the n-type region 71*b* contains n-type impurities at a low concentration. The width of the n⁺-type region 71*a* is wider than that of the n-type region 71*b*. The charge transfer channel 71 extends along the direction $D_H$.

The output transfer path 70*b* has predetermined numbers of transfer electrodes 72, 73 and 77 made of polysilicon layers. Each transfer electrode 72 is formed over the n⁺-type region 71*a*. Each transfer electrode 73 and each transfer electrode 77 are alternately formed over the n-type region 71*b*.

The transfer electrodes 72, 73 and 77 traverse the charge transfer channel 71. The end portions of the transfer electrode 73 on the transfer electrode 72 side overlap the transfer electrodes 72. The end portions of the transfer electrode 77 on the transfer electrode 73 side overlap the transfer electrodes 73. The transfer electrodes 72, 73 and 77 have a so-called overlapping transfer electrode structure.

A potential well region is formed by the n⁺-type region 71*a* and the transfer electrode 72 over the n⁺-type region 71*a*. Similarly, a potential barrier region is formed by the n-type region 71*b* and the transfer electrode 73 or 77 formed over the n-type region 71*b*. The charger transfer stage is formed by one potential barrier region and one potential well region on the next downstream side (on the side of the output unit 80, this definition is also used in the following).

Both the transfer electrode 73 or 77 forming the potential barrier region and the transfer electrode 72 forming the potential well region on the next downstream side are applied with a predetermined voltage level at the same time to form one charge transfer stage.

Electric insulating films are formed on the transfer electrodes 72, 73 and 77. These electric insulating films and above-mentioned electric insulating film (passivation film) are drawn in FIG. 14 as one electric insulating film 74*a* for the simplicity of drawing.

Two pulse supply terminals are used for supplying predetermined drive pulses to the output transfer path 70b, similar to the output transfer path 70 shown in FIG. 1. The transfer electrode 72 and the transfer electrode 73 or 77 on the next downstream side are electrically connected to the same pulse supply terminal. Adjacent two transfer electrodes 72 with the transfer electrode 73 or 77 being interposed therebetween are electrically connected to different pulse supply terminals.

An output transfer path made of a two-phase drive type CCD having a three-layer polysilicon electrode structure has a relatively gentle design rule as compared to an output transfer path made of a two-phase drive type CCD having a two-layer polysilicon electrode structure. For example, if the two-phase drive type CCD having the two-layer polysilicon electrode structure is made to have the so-called overlapping transfer electrode structure shown in FIG. 7 or 11, it is necessary to set the gap between transfer electrodes 73 approximately equal to or smaller than the gap between transfer electrodes 72. Forming such transfer electrodes 73 is severe from the viewpoint of a design rule.

In the two-phase drive type CCD 70b having the three-layer polysilicon electrode structure shown in FIG. 14, forming the transfer electrodes 73 is not severe.

IT-CCD having a fine pixel pitch (pitch $P_2$ of photoelectric conversion elements) along the photoelectric conversion element row direction (direction $D_H$) can therefore be formed by using the output transfer path being composed of a two-phase drive type CCD having the three-layer polysilicon electrode structure. Electrodes made of material other than polysilicon may also be used for forming such IT-CCD.

IT-CCDs of the embodiments have been described. The invention is not limited only to the embodiments.

IT-CCDs of the embodiments have photoelectric conversion elements (photodiodes), vertical transfer CCDs, an output transfer path and the like formed on an n-type semiconductor substrate with a p-type well. Photoelectric conversion elements (photodiodes), vertical transfer CCDs, an output transfer path and the like of IT-CCD may be formed on a p-type semiconductor substrate. Photoelectric conversion elements (photodiodes), vertical transfer CCDs, an output transfer path and the like of IT-CCD may be formed in a semiconductor layer formed on a sapphire substrate or the like. In this specification, a term "semiconductor substrate" is intended to include a substrate made of material different from semiconductor and formed with a semiconductor layer for forming photoelectric conversion elements (photodiodes), vertical transfer CCDs, an output transfer path and the like in the semiconductor layer.

The shape in plan view of a photoelectric conversion element may be a rectangle (including a rhombus), a polygon having five sides or more with all internal angles having an obtuse angle, a polygon having five sides or more with obtuse and acute internal angles, a shape having rounded corners of such shapes, or the like.

The shape in plan view of the photoelectric conversion element region defined by two adjacent transfer electrodes is not limited only to a hexagon, but other shapes may also be used such as a rectangle (including a rhombus), a pentagon, a polygon having seven sides or more, and a shape having rounded corners of such shapes.

The number of charge transfer stages per one photoelectric conversion element in the vertical transfer CCD is not limited only to two, but other numbers three and four may be used.

The shape in plan view of each section of the charge transfer channel in the vertical transfer CCD may be a curved line or a line formed by a straight line and a curved line, in addition to a straight line.

The shape of each transfer electrode in the vertical transfer CCD is preferably a shape connecting the connection area and transfer path forming area at an obtuse angle or a shape smoothly connecting the connection area and transfer path forming area.

Adjacent two transfer electrodes of the vertical transfer CCD may be made of different materials. The material of the transfer electrode may be metal such as aluminum, tungsten and molybdenum, or alloy of two or more of such metals, in addition to polysilicon.

The connection areas of adjacent two transfer electrodes may be superposed completely as shown in FIG. 6A, overlapped in the side portion of one of the connection areas, or positioned side by side.

The shape of the light receiving area of each pixel may be a rectangle (including a rhombus), a polygon having five sides or more with all internal angles having an obtuse angle, a polygon having five sides or more with obtuse and acute internal angles, a shape having rounded corners of such shapes, or the like. In order to eliminate a difference in the light convergence efficiency and sensitivity between pixels of adjacent two pixel rows, the shape of the photosensitive area of each pixel is preferably line symmetrical with both the directions $D_v$ and $D_H$.

It is not necessarily required that the readout gate electrode structure covers in plan view the whole readout gate region. The readout gate region may extend in plan view from the readout gate structure toward the photoelectric conversion element side.

The method of driving the vertical transfer CCD is not limited only to the drive method described above, but other methods may also be used in accordance with the application field of IT-CCD or the like. In accordance with the selected drive method, the number of pulse supply terminals for supplying predetermined pulses to transfer electrodes and the specification of interconnection between the pulse supply terminals and transfer electrodes may be changed. The method of driving the output transfer path may also be changed.

If the two-phase drive type CCD is used as the output transfer path, adjacent transfer electrodes of the two-phase drive type CCD may be made of different materials. The material of the transfer electrode may be metal such as aluminum, tungsten and molybdenum, or alloy of two or more of such metals, in addition to polysilicon.

The number of charge transfer stages of the adjusting portion per one vertical transfer CCD is preferably determined so as to satisfy the following condition: if the charge transfer stages and vertical transfer CCD are driven under the same condition, the potential barrier is formed in the most downstream charger transfer stage immediately before signal charges are transferred to the output transfer path. If this condition is satisfied, it becomes easy to prevent charges to be transferred from the adjusting portion to the output transfer path from flowing away from the adjusting charge transfer channel.

The shape in plan view of a micro lens formed on the light receiving area and covering in plan view the light receiving area may be a rectangle, a rectangle with rounded corners, a polygon having five sides or more with all internal angles having an obtuse angle, a circle, an ellipsoid or the like. The shape in plan view of the micro lens can be determined in accordance with the shape of the light receiving area of each pixel. A micro lens structure having a plurality of condenser lenses including at least one inner lens may be formed on the light receiving area of each pixel.

A pitch between micro lenses in the direction $D_v$ may be the same as or slightly different from the pitch $P_1$ between photoelectric conversion elements in the direction $D_v$. If the pitch between micro lenses in the direction $D_v$ is set different from the pitch $P_1$, the position of each micro lens is changed from the following viewpoints.

The position of each micro lens is changed so that the focal position is at a desired position in the light receiving area of the pixel, for example, at a position where the highest sensitivity and resolution are obtained. This position is changed in accordance with an incidence light direction different at each position in the photosensitive area. In order to improve the pixel sensitivity and resolution, it is preferable that the photoelectric conversion region covers an area near the focal position of the micro lens as broad as possible.

From the same reason, a pitch between micro lenses in the direction $D_H$ may be the same as or slightly different from the pitch $P_2$ between photoelectric conversion elements in the direction $D_H$.

Figure 15A:
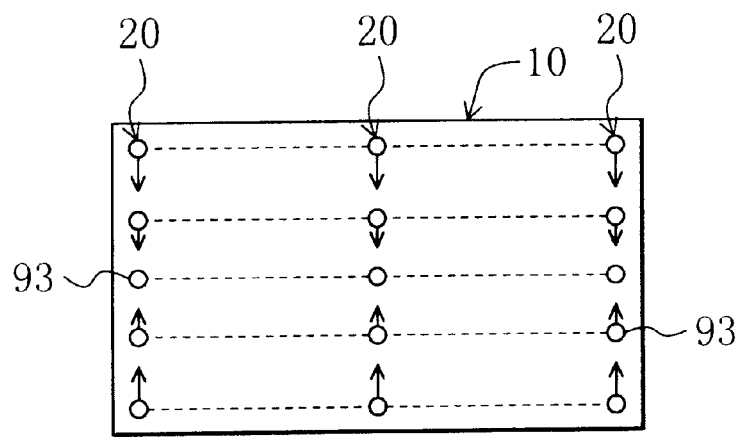
FIGS. 15A, 15B and 15C are diagrams illustrating directions of shifting micro lenses.
Figure 15B:
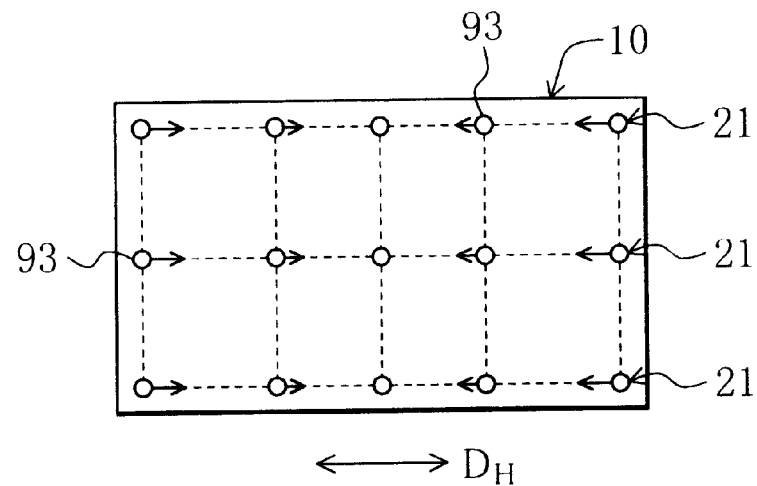
Figure 15C:
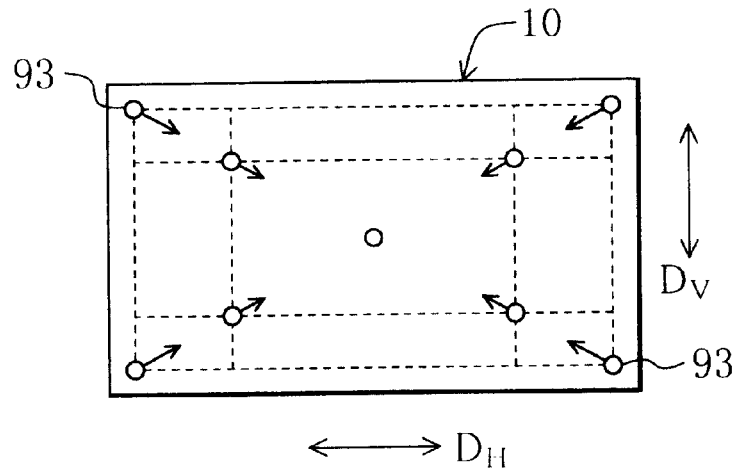

When the positional relation between a photoelectric conversion element and a micro lens is substantially the same for all pixels, the position of an image point formed by a micro lens on the photoelectric conversion element is slightly different in the central area, upper area and lower area of the photoelectric conversion element column. In order to suppress a shift of the position of an image point formed by a micro lens on the photoelectric conversion element from a desired position, it is preferable to change the position of each micro lens by the following three methods (1) to (3). (1) As schematically shown in FIG. 15A, the positions of micro lenses 93 in the upper and lower areas of each photoelectric conversion element column 20 are changed more to the central area as the position of the photoelectric conversion element becomes remoter from the central area. Arrows in FIG. 15A indicate the position change directions of the micro lenses 93. (2) As schematically shown in FIG. 15B, the positions of micro lenses 93 in right and left areas of each photoelectric conversion element row 21 are changed more to the central area of the photosensitive area 10 along the direction $D_H$ as the position of the photoelectric conversion element becomes remoter from the central area. Arrows in FIG. 15B indicate the position change directions of the micro lenses 93. (3) As schematically shown in FIG. 15C, the positions of micro lenses 93 are changed more to the central area of the photosensitive area 10 along the directions $D_H$ and $D_v$ as the position of the photoelectric conversion element becomes remoter from the central area. Arrows in FIG. 15C indicate the position change directions of the micro lenses 93.

By changing the positions of the micro lenses by the methods (1) to (3), luminance shading can be improved.

The color filter array of IT-CCD may use various color filters capable of taking a color image. A color filter array of three primary colors (red, green and blue) and a color filter array of complementary colors are known.

A complementary color filter array may be composed of: (i) color filters of green (G), cyan (Cy) and yellow (Ye); (ii) color filters of cyan (Cy), yellow (Ye) and white or achromatic (W); (iii) color filters of cyan (Cy), magenta (Mg), yellow (Ye) and green (G): (iv) color filters of cyan (Cy), yellow (Ye), green (G), and white or achromatic (W); or the like.

Figure 16A:
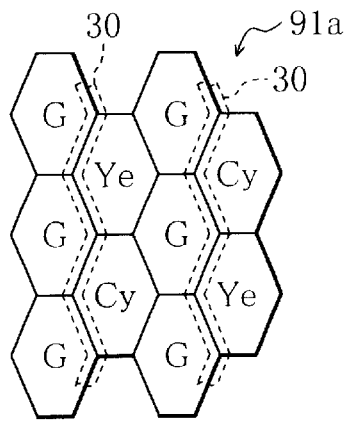
FIGS. 16A, 16B, 16C, 16D and 16E are plan views showing examples of a color filter array of a complementary color type.
Figure 16B:
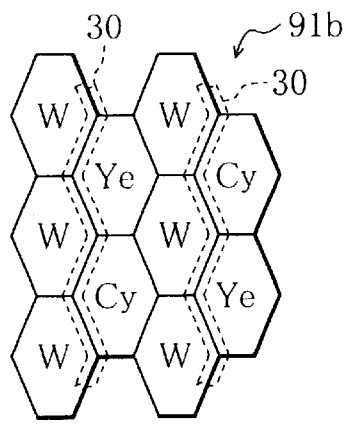
Figure 16C:
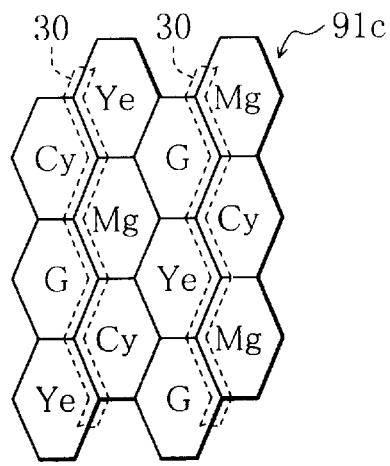
Figure 16D:
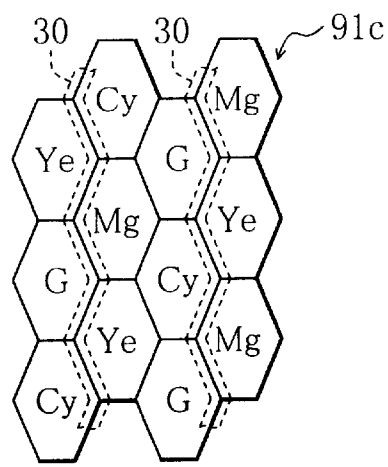
Figure 16E:
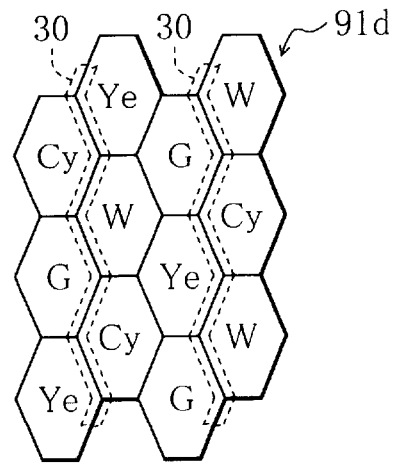

FIG. 16A is a plan view showing an example of a complementary color filter array 91a having the color filters (i). FIG. 16B is a plan view showing an example of a complementary color filter array 91b having the color filters (ii). FIG. 16C is a plan view showing an example of a complementary color filter array 91c having the color filters (iii). FIG. 16D is a plan view showing another example of the complementary color filter array 91c having the color filters (iii). FIG. 16E is a plan view showing an example of a complementary color filter array 91d having the color filters (iv).

In FIGS. 16A to 16E, hexagons surrounding alphabet G, Cy, Ye, W and Mg show color filters. The alphabet G, Cy, Ye, W and Mg shows the colors of color filters. Vertical transfer CCDs 30 are also drawn in FIGS. 16A to 16E.

The layout of color filters of a three primary color filter array is not limited only to that shown in FIG. 10. Similarly, the layouts of color filters of complementary color filter arrays are not limited only to those shown in FIGS. 16A to 16E.

IT-CCD of each embodiment has photoelectric conversion elements (photodiodes) 22 formed in the p-type well 2 of the n-type semiconductor substrate 1. A vertical type overflow drain structure can therefore be formed in IT-CCD of the embodiment. An electronic shutter can therefore be formed. In forming the vertical type overflow drain structure in IT-CCD, a reverse bias is applied between the p-type well 2 and the lower region (region lower than the p-type well 2) of the n-type semiconductor substrate 1. A horizontal type overflow drain structure may be formed in place of a vertical type overflow drain structure. A vertical or horizontal type overflow drain structure facilitates to suppress blooming.

Various IT-CCD driving methods may be selectively used. In accordance with the selected method, the structure of the driving pulse supply means for supplying predetermined drive pulses to the vertical transfer CCDs (transfer electrodes constituting the vertical transfer CCDs) and output transfer path (transfer electrodes constituting the output transfer path) may be changed.

It is apparent that other various modifications, improvements, combinations, and the like can be made by those skilled in the art.

IT-CCD of the invention can form relatively wide transfer electrodes of the output transfer path (horizontal transfer CCD) even if a pixel density is increased. According to the invention, IT-CCD with low cost can be provided which has a high pixel density and small power consumption.

We claim:

1. A solid state image pickup device, comprising:
    a semiconductor substrate;
    a number of photoelectric conversion elements disposed on a surface of the semiconductor substrate in a plurality of columns and rows, a photoelectric conversion element column and a photoelectric conversion element row each being composed of a plurality of photoelectric conversion elements, a plurality of photoelectric conversion elements of an even column being shifted in a column direction by about a half of the pitch between adjacent photoelectric conversion elements in each photoelectric conversion element column, from a plurality of photoelectric conversion elements of an odd column, and a plurality of photoelectric conversion elements of an even row being shifted in a row direction by about a half of the pitch between adjacent photoelectric conversion elements in each photoelectric conversion element row, from a plurality of photoelectric conversion elements of an odd row;

charge transfer channels each provided for two photoelectric conversion element columns and formed in the surface of the semiconductor substrate in an area in plan view between the two photoelectric conversion element columns, said charge transfer channel extending as a whole along a direction of the photoelectric conversion element column and having a zigzag shape;

a plurality of transfer electrodes formed on the semiconductor substrate, traversing in plan view each of said charge transfer channels, said transfer electrode having transfer path forming areas same in number as said charge transfer channels, the transfer path forming area forming one charge transfer stage in a cross area in plan view with a corresponding charge transfer channel, adjacent two transfer electrodes with one photoelectric conversion element row being interposed therebetween repeating in plan view divergence and convergence and surrounding in plan view each photoelectric conversion element in the photoelectric conversion element row of an even or odd row to define photoelectric conversion element region, said transfer electrode extending as a whole along a direction of the photoelectric conversion element row;

a readout gate region provided for each photoelectric conversion element in the surface of the semiconductor substrate to be contiguous to the photoelectric conversion element and to a corresponding charge transfer channel, said readout gate region corresponding to the photoelectric conversion element of the even row and said readout gate region corresponding to the photoelectric conversion element of the odd row being covered in plan view with different transfer electrodes; and an adjusting portion formed downstream of downstream ends of said charge transfer channels, said adjusting portion including a plurality of charge transfer stages for adjusting a phase of signal charges transferred from each of said charge transfer channels.

2. A solid state image pickup device according to claim 1, wherein said plurality of transfer electrodes include a plurality of first and second transfer gates formed alternately, the transfer path forming area of one of the first and second transfer electrodes being formed on each readout gate region contiguous to a corresponding photoelectric conversion element of the odd row, and the transfer path forming area of the other of the first and second transfer electrodes being formed on each readout gate region contiguous to a corresponding photoelectric conversion element of the even row.

3. A solid state image pickup device according to claim 1, wherein a width of the transfer path forming area of each of the first and second transfer electrodes is wider than a width of the other area thereof.

4. A solid state image pickup device according to claim 1, wherein each of said charge transfer channel and said transfer electrodes form two charge transfer stages for each said photoelectric conversion element row.

5. A solid state image pickup device according to claim 1, further comprising a light shielding film formed over the semiconductor substrate, said light shielding film being formed with an opening on each corresponding photoelectric conversion element.

6. A solid state image pickup device according to claim 5, wherein shapes, sizes and directions in plan view of the openings are substantially same.

7. A solid state image pickup device according to claim 5, wherein a shape in plan view of the opening is a rectangle, a pentagon, or a hexagon.

8. A solid state image pickup device according to claim 5, further comprising a micro lens formed on each opening and covering in plan view the opening.

9. A solid state image pickup device according to claim 8, further comprising a color filter disposed between each opening and a corresponding micro lens and covering in plan view the opening.

10. A solid state image pickup device according to claim 1, further comprising a driver circuit for applying a field shift pulse to each of said transfer electrodes covering the readout gate regions.

11. A solid state image pickup device according to claim 1, further comprising an output transfer path being composed of a two-phase drive type CCD having a two-layer electrode structure or a two-phase drive type CCD having a three-layer electrode structure, said output transfer path receiving from said charge transfer channels the signal charges accumulated in said photoelectric conversion elements through photoelectric conversion and transferring the received signal charges toward a predetermined direction.

12. A solid state image pickup device according to claim 1, wherein said adjusting portion includes charge transfer stages for changing a transfer direction of the signal charges from a direction slanted from the direction of the photoelectric conversion element column to the column direction.

13. A driving method for a solid state image pickup device comprising: a semiconductor substrate; a number of photoelectric conversion elements disposed on a surface of the semiconductor substrate in a plurality of columns and rows, a photoelectric conversion element column and a photoelectric conversion element row each being composed of a plurality of photoelectric conversion elements, a plurality of photoelectric conversion elements of an even column being shifted in a column direction by about a half of the pitch between adjacent photoelectric conversion elements in each photoelectric conversion element column, from a plurality of photoelectric conversion elements of an odd column, and a plurality of photoelectric conversion elements of an even row being shifted in a row direction by about a half of the pitch between adjacent photoelectric conversion elements in each photoelectric conversion element row, from a plurality of photoelectric conversion elements of an odd row; charge transfer channels each provided for two photoelectric conversion element columns and formed in the surface of the semiconductor substrate in an area in plan view between the two photoelectric conversion element columns, said charge transfer channel extending as a whole along a direction of the photoelectric conversion element column and having a zigzag shape; a plurality of transfer electrodes formed on the semiconductor substrate, traversing in plan view each of said charge transfer channels, said transfer electrode having transfer path forming areas same in number as said charge transfer channels, the transfer path forming area forming one charge transfer stage in a cross area in plan view with a corresponding charge transfer channel, adjacent two transfer electrodes with one photoelectric conversion element row being interposed therebetween repeating in plan view divergence and convergence and surrounding in plan view each photoelectric conversion element in the photoelectric conversion element row of an even or odd row to define photoelectric conversion element region, said transfer electrode extending as a whole along a direction of the photoelectric conversion element row; a readout gate region provided for each photoelectric conversion element in the surface of the semiconductor substrate to be contiguous to the photoelectric conversion element and to a corresponding charge transfer channel, said readout gate region corresponding to the photoelectric conversion element of the even row and said readout gate region corresponding to the photoelectric conversion element of the odd row being covered in plan view with different transfer electrodes; and an adjusting portion formed downstream of downstream ends of said charge transfer channels, said adjusting portion including a plurality of charge transfer stages for adjusting a phase of signal charges transferred from each of said charge transfer channels, the driving method comprising the steps of:

reading the signal charges accumulated in each photoelectric conversion element of at least one photoelectric conversion element row, to the charge transfer channel corresponding to the photoelectric conversion element via the readout gate region contiguous to the photoelectric conversion element, during one vertical blanking period; and converting the signal charges read to the charge transfer channel into an image signal and outputting the image signal, during a period after the one vertical blanking period and before a next vertical blanking period.

* * * * *